United States Patent
Inganäs et al.

(10) Patent No.: US 11,785,788 B2
(45) Date of Patent: *Oct. 10, 2023

(54) LAMINATED SOLAR CELL MODULE AND METHOD OF MANUFACTURING SAID MODULE

(71) Applicant: Epishine AB, Norrköping (SE)

(72) Inventors: Olle Inganäs, Linköping (SE); Thomas Österberg, Linköping (SE); Wanzhu Cai, Linköping (SE)

(73) Assignee: EPISHINE AB, Linköping (SE)

( * ) Notice: Subject to any disclaimer, the term of this patent is extended or adjusted under 35 U.S.C. 154(b) by 19 days.

This patent is subject to a terminal disclaimer.

(21) Appl. No.: 16/487,023

(22) PCT Filed: Feb. 20, 2018

(86) PCT No.: PCT/EP2018/054172
§ 371 (c)(1),
(2) Date: Aug. 19, 2019

(87) PCT Pub. No.: WO2018/150053
PCT Pub. Date: Aug. 23, 2018

(65) Prior Publication Data
US 2020/0203647 A1    Jun. 25, 2020

(30) Foreign Application Priority Data
Feb. 20, 2017    (EP) .................... 17156944

(51) Int. Cl.
*H01L 51/44*    (2006.01)
*H01L 51/00*    (2006.01)
(Continued)

(52) U.S. Cl.
CPC ............ *H10K 30/88* (2023.02); *H10K 30/81* (2023.02); *H10K 71/40* (2023.02); *H10K 71/50* (2023.02); *H10K 77/111* (2023.02)

(58) Field of Classification Search
CPC ............... H01L 51/448; H01L 51/0024; H01L 51/0026; H01L 51/0097; H01L 51/441; H01L 51/424; Y02E 10/549
See application file for complete search history.

(56) References Cited

U.S. PATENT DOCUMENTS 6,340,789 B1 * 1/2002 Petritsch ............. H01L 51/0024
136/263
6,382,367 B1    5/2002 Varzescu et al.
(Continued)

FOREIGN PATENT DOCUMENTS

EP    1902476 A2    3/2008
EP    3364474 A1    8/2020
(Continued)

OTHER PUBLICATIONS

JP2006237165A, Machine Translation (Year: 2006).*
(Continued)

*Primary Examiner* — Devina Pillay
(74) *Attorney, Agent, or Firm* — Hamilton, Brook, Smith & Reynolds, P.C.

(57) ABSTRACT

The present invention relates to a method for laminating solar cell modules comprising a plurality of solar cells electrically connected in series. The method comprises: providing a first and a second flexible substrate portion suitable for roll-to-roll deposition; providing a plurality of first electrodes on said first substrate portion and a plurality of second electrodes on said second substrate portion, wherein said plurality of first and second electrodes are provided as stripes spatially separated such that a plurality of gaps is formed; depositing a continuous or discontinuous active layer on said plurality of first electrodes or said plurality of second electrodes, where in said continuous or discontinuous active layer is an organic active layer; laminating by means of heat and pressure said first and said (Continued)

second substrate portions together in a roll-to-roll process such that the active layer is brought into physical contact with the other one of said plurality first electrodes or said plurality of second electrodes and such that the active layer is brought into electrical contact with said plurality of first electrodes and said plurality of second electrodes. The plurality of first electrodes is arranged off-set relative said plurality of second electrodes such that each of said plurality of gaps between said plurality of second electrodes are fully covered at least in one direction by respective one of said plurality of first electrodes. The present invention also relates to a solar cell module.

7 Claims, 9 Drawing Sheets

(51) Int. Cl.
  *H10K 30/88* (2023.01)
  *H10K 30/81* (2023.01)
  *H10K 71/40* (2023.01)
  *H10K 71/50* (2023.01)
  *H10K 77/10* (2023.01)

(56) References Cited

U.S. PATENT DOCUMENTS

| | | | |
|---|---|---|---|
| 11,532,788 | B2 | 12/2022 | Österberg et al. |
| 2002/0149010 | A1* | 10/2002 | Wakimoto .......... H01L 51/0053 257/40 |
| 2003/0022409 | A1 | 1/2003 | Epstein et al. |
| 2005/0236037 | A1 | 10/2005 | Ahn et al. |
| 2005/0263180 | A1 | 12/2005 | Montello et al. |
| 2007/0125419 | A1 | 6/2007 | Gui et al. |
| 2009/0152534 | A1 | 6/2009 | Chabinyc et al. |
| 2010/0276071 | A1 | 11/2010 | Shrotriya et al. |
| 2014/0116493 | A1 | 5/2014 | Lee et al. |
| 2014/0202517 | A1* | 7/2014 | Kippelen ............ H01L 31/0224 136/244 |
| 2016/0196927 | A1* | 7/2016 | Bryant ................ H01G 9/2059 136/244 |
| 2017/0237013 | A1* | 8/2017 | Park .................... H01L 51/0074 257/40 |

FOREIGN PATENT DOCUMENTS

| | | | | |
|---|---|---|---|---|
| JP | 2002508599 | A | | 3/2002 |
| JP | 2006237165 | A | * | 9/2006 ........... H01L 27/301 |
| JP | 2006237165 | A | | 9/2006 |
| JP | 2014523138 | A | | 9/2014 |
| WO | 99/49525 | A1 | | 9/1999 |
| WO | 2009126115 | A1 | | 10/2009 |
| WO | 2014/114951 | A1 | | 7/2014 |
| WO | 2018/150053 | A1 | | 8/2018 |
| WO | 2020/038937 | A1 | | 2/2020 |

OTHER PUBLICATIONS

Notification of Transmittal of the International Preliminary Report on Patentability dated May 2, 2019 for International Application No. PCT/EP2018/054172 filed Feb. 20, 2018 entitled "Laminated Solar Cell Module and Method of Manufacturing Said Module".
Huang et al., "A Semi-transparent Plastic Solar Cell Fabricated by a Lamination Process," Advanced Materials, 20, 415-419, 2008.
Kaduwal et al., "ITO-free laminated concept for flexible organic solar cells," Solar Energy Materials & Solar Cells, 120, 449-453, 2014.
Nakamura et al., "High-performance polymer photovoltaic devices with inverted structure prepared by thermal lamination," Solar Energy Materials & Solar Cells, 93, 1681-1684, 2009.
Notification of Transmittal of the International Search Report and Written Opinion dated May 29, 2019 for International Application No. PCT/EP2018/054172 filed Feb. 20, 2018 entitled "Laminated Solar Cell Module and Method of Manufacturing Said Module".
International Search Report and the Written Opinion for International Application No. PCT/EP2019/072256, titled: Laminated Module, dated Nov. 12, 2019.
International Preliminary Report on Patentability for International Application No. PCT/EP2019/072256, titled: Laminated Module, dated Nov. 17, 2020.
International Search Report and Written Opinion for International Application No. PCT/EP2019/074524, titled "Solar Cell Lamination," dated Dec. 11, 2019.
International Preliminary Report on Patentability for International Application No. PCT/EP2019/074524, titled "Solar Cell Lamination," dated Dec. 9, 2020.
Extended European Search Report for EP Application No. 18189760. 4-1230, titled: Laminated Module, dated Feb. 13, 2019.
ZhenZhen et al., "Incorporating an Electrode Modification Layer with a Vertical Phase Seperated Photoactive Layer for Efficient and Stable Inverted Nonfullerene Plymer Solar Cells," ACS Applied Materials & Interfaces, 9(50): 43871-43879 (2017).
Non-Final Office Action for U.S. Appl. No. 17/268,736, dated May 23, 2022, entitled "Laminated Module".
Notice of Allowance for U.S. Appl. No. 17/268,736, titled "Laminated Module" consisting of 7 pages. dated Aug. 29, 2022.
Non-Final Office Action for U.S. Appl. No. 17/275,114, dated Sep. 7, 2022 titled "Solar Cell amination".
Communication Pursuant to Article 94(3) EPC in European Application No. 18706501.6 dated May 11, 2022 (5 pages).
Japanese Office Action in Japanese Application No. 2019-565981 dated Feb. 8, 2022 (6 pages).
Notice of Allowance for U.S. Appl. No. 17/275,114, titled "Solar Cell Lamination" consisting of 12 pages, dated Feb. 10, 2023.

* cited by examiner

LAMINATED SOLAR CELL MODULE AND METHOD OF MANUFACTURING SAID MODULE

This application is the U.S. National Stage of International Application No. PCT/EP2018/054172, filed Feb. 20, 2018, which designates the U.S., published in English, and claims priority under 35 U.S.C. § 119 or 365(c) to European Application No. 17156944.5, filed Feb. 20, 2017. The entire teachings of the above applications are incorporated herein by reference.

TECHNICAL FIELD OF THE INVENTION

The present invention relates to a method for producing a laminated solar cell module and a laminated solar cell module.

BACKGROUND OF THE INVENTION

To mitigate global warming the energy generation must change from being dominated by fossil fuels in to sources with a low climate impact. Solar cells, that convert light energy directly in to electrical energy, are expected to be a major source of electricity in the future energy system. Solar cells are commonly produced from silicon oxide that is melted, purified and grown in to silicon crystals. This is a highly energy consuming process, why many thin film technologies with less energy demanding manufacturing processes have been developed. In general, a thin film solar cell comprises a photo-active semiconductor sandwiched between two electrodes. Organic solar cells are an example of thin film solar cells with a photoactive layer composed of a fine mixture of two or more organic semiconductors. A large advantage with this kind of solar cells is that they can be printed in a roll to roll process and therefore it is possible to produce large area solar cells or solar cell modules. Moreover, the material use and process energy is very low, enabling a truly low climate impact. These materials are also efficient in converting diffuse light to electricity. This allows placing organic solar cells also on vertical surfaces such as walls.

Formation of pinholes in the active layer during printing is a known issue that can lead to direct contact between the two electrodes that short circuits the solar cell and thus degrades the performance. A problem with the present printed solar cells and solar cell modules, based on semiconducting organic molecules, is that the risk for creating pinholes, extending through the active layer, is relatively large. Such pinholes usually decrease the efficiency of the solar cell since they lead to short circuits and parts of the printed solar cell or solar cell module will therefore not work properly. There is a need to improve the current state of the art in order to overcome this problem.

SUMMARY OF THE INVENTION

It is an object of the present invention to improve the current state of the art and to mitigate at least some of the above mentioned problems. These and other objects are achieved by a method for producing a laminated solar cell module and such a solar cell module.

According to a first aspect of the present invention, a method for laminating solar cell modules comprising a plurality of solar cells connected in series is provided. The method comprises:

providing a first and a second flexible substrate portion suitable for roll-to-roll deposition;

providing a plurality of first electrodes on said first substrate portion and a plurality of second electrodes on said second substrate portion, wherein said plurality of first and second electrodes are provided as stripes spatially separated such that a plurality of gaps is formed;

depositing a continuous or discontinuous active layer on said plurality of first electrodes or said plurality of second electrodes, wherein said continuous or discontinuous active layer is an organic active layer;

laminating by means of heat and pressure said first and said second substrate portions together in a roll-to-roll process such that the active layer is brought into physical contact with the other one of said plurality first electrodes or said plurality of second electrodes, and such that the active layer is brought into electrical contact with said plurality of first electrodes and said plurality of second electrodes;

wherein said plurality of first electrodes is arranged off-set relative said plurality of second electrodes such that each of said plurality of gaps between said plurality of second electrodes are fully covered at least in one direction by respective one of said plurality of first electrodes.

The plurality of gaps is typically between the electrodes in said plurality of first electrodes on said first substrate portion, and between the electrodes in said plurality of second electrodes on said second substrate portion. Thus, when stating that said plurality of first electrodes is arranged off-set relative said plurality of second electrodes such that each of said plurality of gaps between said plurality of second electrodes are fully covered at least in one direction by respective one of said plurality of first electrodes, it should be understood that each of said plurality of gaps between said plurality of second electrodes are fully covered at least in a direction which is orthogonal to the first and second substrate portions.

According to a second aspect, of the present invention a method for laminating solar cell modules comprising a plurality of solar cells connected in series is provided. The method comprises:

providing a first and a second flexible substrate portion suitable for roll-to-roll depositing;

providing a plurality of first electrodes on said first substrate portion and a plurality of second electrodes on said second substrate portion wherein said plurality of first and second electrodes are provided as stripes spatially separated such that a plurality of gaps is formed;

depositing a first continuous or discontinuous active layer on said plurality of first electrodes and a second continuous or discontinuous active layer on said plurality of second electrodes, wherein at least one of said first and second continuous or discontinuous active layers is an organic active layer;

laminating by means of heat and pressure said first and said second substrate portions together in a roll-to-roll process such that the first continuous or discontinuous active layer is brought into physical contact with the second continuous or discontinuous active layer, and such that said first and said second continuous or discontinuous active layer is brought into electrical contact with said plurality of first electrodes and said plurality of second electrodes; and wherein said plurality of first electrodes is arranged off-set relative said plurality of second electrodes such that each of said plurality of gaps between said plurality of second electrodes are fully covered in at least one direction by respective one of said plurality of first electrodes.

Correspondingly to the first aspect of the present invention, the plurality of gaps is typically between the electrodes in said plurality of first electrodes on said first substrate portion, and between the electrodes in said plurality of second electrodes on said second substrate portion. Thus, when stating that said plurality of first electrodes is arranged off-set relative said plurality of second electrodes such that each of said plurality of gaps between said plurality of second electrodes are fully covered at least in one direction by respective one of said plurality of first electrodes, it should be understood that each of said plurality of gaps between said plurality of second electrodes are fully covered at least in a direction which is orthogonal to the first and second substrate portions.

According to a third aspect of the present invention a method for laminating solar cell modules comprising a plurality of solar cells connected in series is provided. The method comprises:

providing a first and a second flexible substrate portion suitable for roll-to-roll deposition;

providing a plurality of first electrodes on said first substrate portion and a plurality of second electrodes on said second substrate portion, wherein said plurality of first and second electrodes are provided as stripes spatially separated such that a plurality of gaps is formed;

depositing a first continuous or discontinuous active layer on said plurality of first electrodes and optionally a second continuous or discontinuous active layer on said plurality of second electrodes, wherein said first continuous or discontinuous active layer is an organic active layer;

laminating by means of heat and pressure said first and said second substrate portions together such that the first continuous or discontinuous active layer is brought into electrical contact with said plurality of first electrodes and said plurality of second electrodes; and wherein said plurality of first electrodes is arranged off-set relative said plurality of second electrodes such that each of said plurality of gaps between said plurality of second electrodes are fully covered by respective one of said plurality of first electrodes.

Correspondingly to the first and second aspect of the present invention, the plurality of gaps is typically between the electrodes in said plurality of first electrodes on said first substrate portion, and between the electrodes in said plurality of second electrodes on said second substrate portion.

Effects and features of these first, second and third aspect of the present invention are largely analogous. Most embodiments mentioned below are compatible with all of these three aspects of the invention.

Providing an active layer which is brought in physical contact with a plurality of first or second electrodes after deposition reduces the risk for short circuits occurring due to pinholes in the active layer. Normally, the plurality of second electrodes may be wet deposit on top of the active layer which allows for filling pinholes in the active layer with electrode material. This increases the risk for direct contact between one of the plurality of first electrodes and one of the plurality of second electrodes which may result in a short circuit. Bringing the active layer and the plurality of electrodes together after drying instead of wet deposit the electrodes on top of the active layer, hinders the electrode material to fill the pinholes and therefore is the risk for short circuits reduced. Moreover, when providing a first and a second active layer which is brought into physical contact with each other after deposition, pinholes formed during deposition may extend through the first or the second active layer respectively and hence they will not extend the full, combined thickness of the two active layers. This also reduces the risk for short circuits in the solar cell module. Hence, a more efficient solar cell module will be achieved. Furthermore, post-processing steps to remove shunts can be omitted or at least reduced compared to prior art solutions.

Moreover, by the reduction of risk for short circuits, the solar cell modules according to the invention are particularly suited for low light conditions, as avoiding shunt currents is more critical for such applications. For example, the solar cell modules may be used for indoor energy harvesting applications. Thus, according to at least another example of the present invention, a solar cell module laminated according to any one of the first to third aspects of the invention, can be used in a low light condition, such as e.g. indoor for indoor energy harvesting.

Arranging the plurality of first electrodes off-set relative the plurality of second electrodes enables for a solar cell module where the substrate area is covered to a larger extent by the active area of the solar cells in the solar cell module as compared to having the plurality of first electrodes aligned with the plurality of second electrodes, since it allows for a smaller distance between two adjacent electrodes. The active area being the combined active area of each of the solar cells which are connected in series in the solar cell module. This arrangement may also facilitate the production of these solar cell modules.

Directions and extensions of the solar cell module will below be discussed using a coordinate system. The y-direction is orthogonal or perpendicular to the first and the second substrate portion. The z-direction is parallel to the longest extension of the electrodes. The x-direction is orthogonal or perpendicular to the extension of the electrodes which may be parallel to the longest extension of the substrate portions but it may also be a direction transverse to the longest extension of the substrate portions. The longest direction of the substrate portions may be parallel to the coating direction of the roll-to-roll deposition. The longest direction of the substrate portions may be parallel to the moving direction of said substrate during the roll-to-roll deposition.

It shall be understood that the expression "A covers B in at least one direction" means that any imaginary line, parallel to and directed in that one direction, will run through A before running through B. For example, a line perpendicular to the substrate, i.e. directed in the x-direction, will first run through a one of the plurality of first electrodes before it runs through a gap between two of the plurality of second electrodes. Fully covered means that this is valid for all x-values, e.g. for all values of x where there is a gap at one of the substrates there is an electrode at the opposite substrate. In other words, in a cross-section showing the x-y-plane of the solar cell module, the distance between the two endpoints in the x-direction of an electrode is wider than the distance between the two endpoints in the x-direction of a gap. What is stated here is true for the electrode area used in one of the solar cells, at the edges of the electrodes (z-direction) this might not be fulfilled.

Moreover, it shall be understood that the plurality of first electrodes and the plurality of second electrodes are arranged in an interleaved manner wherein all, or all but one, or all but two of the plurality of first electrodes fully covers a respective one of the plurality of gaps between the plurality of second electrodes and wherein all, or all but one, or all but two of the plurality of second electrodes fully covers a respective one of said plurality of gaps between said plurality of first electrodes.

It should be understood that the plurality of first electrodes is provided on said first substrate portion as stripes spatially separated such that a first set of plurality of gaps is formed between the electrodes in said plurality of first electrodes on said first substrate portion. Correspondingly, the plurality of second electrodes is provided on said second substrate portion as stripes spatially separated such that a second set of plurality of gaps is formed between the electrodes in said plurality of second electrodes on said second substrate portion.

According to at least one example embodiment of the present invention a centre of a gap in the x-direction is aligned with a centre portion of a covering electrode in the x-direction or a centre of an electrode in the x-direction is aligned with a centre of a gap in the x-direction between electrodes on the opposite substrate portion.

According to at least one example embodiment of the invention the plurality of first and second electrodes are arranged such that an electrical connection between the electrodes is achieved via the continuous or discontinuous active layer or via the first and second continuous or discontinuous active layers.

According to at least one example embodiment of the invention the plurality of first electrodes comprises 3-50 electrodes, or 5-40 electrodes, or 5-30 electrodes, or 10-30 electrodes. According to at least the plurality of second electrodes comprises 2-50 electrodes, or 5-40 electrodes, or 10-30 electrodes. The plurality of first and second electrodes may comprise the same or different number of electrodes.

According to at least one example embodiment of the invention width in the x-direction of the each of the plurality of first and second electrodes may be 1-20 mm, or at least 2-15 mm, or 2-10 mm. The width may be the same for all the electrodes or it may not be the same for all the electrodes.

According to at least one example embodiment of the invention the length in z-direction of each of the plurality of first and second electrodes may be at least 10 mm, or at least 20 mm, or at least 50 mm, or at least 100 mm, or at least 300 mm, or at least 500 mm, or at least 1000 mm. The length of the electrodes is decided by the length of the first or the second substrate portions. The first and the second substrate portion may be for example 0.5 m, or 1 m, or 5 m, or 10 m long but according to some embodiments of the invention the first and/or the second substrate portion may also be up to several 100 meters long. The substrate portions may for example be provided on a roll, such a roll may include one or several substrate portions. Additionally, or alternatively, the length in the z-direction of each of the plurality of first and second electrodes may be at least 70%, or at least 80%, or at least 90% of the length of the substrate portion in the same direction. The length of the electrodes may be the same as the length of the substrate portion. Additionally, or alternatively, the length of the electrodes may at least be two times, or three times, or five times longer than the width of each of the plurality of the first and second electrode. For example, if the width in the x-direction of one of the electrodes is 20 mm, the length in the z-direction of that electrode may at least be 40 mm, or at least 60 mm, or at least 100 mm. For example, if the width in the x-direction of each of the plurality of first or second electrodes is 9 mm, then the length in the z-direction each of the plurality of first or second electrodes may be at least 300 mm.

According to at least one example embodiment the plurality of first and second electrodes comprises an electrode material which electrode material may be a conducting organic compound, a metal, a metal oxide or combinations thereof. The conducting organic compound may for example be a conducting organic small molecule or a conducting polymer. The conducting polymer may for example be poly(3,4-ethylenedioxythiophene) polystyrene sulfonate (PEDOT:PSS) or variants thereof, e.g. PEDOT:PSS PH1000. The metal may be chosen from a list comprising but not limited to: aluminium (Al), chromium (Cr), titanium (Ti), cupper (Cu), gold (Au) and silver (Ag). The metal oxide may be for example indium tin oxide (ITO) and aluminium zinc oxide (AZO). According to at least one example embodiment of the present invention, the electrode may comprise one or more layers. For example, the electrode may be an ITO/metal/ITO (IMI) electrode comprising a first layer of ITO, a second layer of a metal and a third layer of ITO. The electrode may for example comprise ITO/Ag/ITO.

It shall be understood that the plurality of first and the second electrodes may extend in any direction over the substrate portions and they may have any extension, linear or non-linear e.g. curved. They may also be parallel or non-parallel. Moreover, it shall be understood that they have the substantially same width of the entire length or they may have a varying width of the entire length. All of the plurality of first and second electrodes may have the same width or different electrodes may have different widths.

According to at least one example embodiment of the present invention the plurality of first and second electrodes may be provided by a variety of deposition techniques, for example they may be provided by means of thermal evaporation, sputtering, spray-coating, printing or coating e.g. slot-die coating. According to at least one embodiment of the present invention the plurality of first electrodes and the plurality of second electrodes may be provided by the same deposition technique. According to at least another example embodiment of the invention the plurality of first and second electrodes may be provided by different techniques.

According to at least one example embodiment of the present invention the plurality of first and second electrodes may be provided, e.g. evaporated, spray-coated, or printed, by an additive or subtractive method. When using an additive method, the electrodes are provided directly as stripes on the first and the second substrate portion respectively. A subtractive method comprises a first step where the electrode material is provided all over the substantially full surface area of the first and/or second substrate portion and a second step which comprises removing the electrode material so that the plurality of first and second electrodes are formed respectively, e.g. by laser ablation. By using such a subtractive method, the area of gaps which is formed in between each of the plurality of first and/or second electrodes may be decreased, i.e. the distance between each of the plurality of first and/or second electrode may be decreased. Decreasing the area of the gaps allows for a larger solar cell photo-active area and hence the capacity of the solar cell module will increase. Alternatively, the second step of the subtractive method, e.g. laser ablation, may be performed after the step of laminating. Hence, the second step, e.g. laser ablation may be done through the PET substrate.

According to at least one example embodiment of the invention the width in the x-direction of the gaps may be in the range of 0.01-10 mm, or preferable in the range of 0.02-5 mm, or even more preferably 0.05-3 mm. The width in the x-direction of the gaps may vary depending on the method with which the plurality of first and second electrodes are provided. If the electrodes are provided with an additive method, the width of the gaps in the x-direction may be in the range of 0.5-3 mm, e.g. 1 mm. If the electrodes are provided with a subtractive method, e.g. using laser ablation, the electrodes may be in the range of 0.01-0.2 mm, e.g. 0.05 mm.

According to at least one example embodiment of the present invention the method further comprises a step of providing a first and a second contacting electrode. The first and the second contacting electrodes may be provided on the first and/or the second substrate portion. The first and the second contacting electrode may be provided on the same substrate portion or they may be provided on different substrate portions. The contacting electrode may comprise one or several layers, which layer may have the same or different extension in the z-direction and they may also have the same or different width in the x-direction. Further, the layers may comprise the same or different materials.

According to at least one example embodiment of the invention the first and the second contacting electrode may comprise a first layer of an electrode material provided by e.g. evaporated, spray-coated, or printed, and a busbar connected thereto. The busbar may for example be made from graphite or silver and may be screen printed. Optionally Instead of, or in addition to, the busbar, the connecting electrode may comprise further printed or laminated layers. The contacting electrodes may be divided in two parts, where the first part may be used as one of the electrodes in one solar cell comprised in the solar cell module and where the other part is used for connecting the solar cell module to a unit for collecting electricity when the solar cell module is in use. The part of the contacting electrode used for connecting the solar cell module is normally not covered by active layer.

According to at least one example embodiment of the present invention the contacting electrodes comprises an electrode material which may comprise a conducting organic compound, a conducting carbon compound, a metal, a metal oxide or combinations thereof. The conducting organic compound may for example be a conducting organic small molecule or a conducting polymer. The conducting polymer may for example be poly(3,4-ethylenedioxythiophene) polystyrene sulfonate (PEDOT:PSS) or variants thereof, e.g. PEDOT:PSS PH1000. The conducting carbon compound may be provided as a carbon paste or as graphite or graphene. The metal may be chosen from a list comprising but not limited to: aluminium (Al), chromium (Cr), titanium (Ti), cupper (Cu), gold (Au) and silver (Ag). The metal oxide may be chosen from a list comprising but not limited to: indium tin oxide (ITO) and aluminium zinc oxide (AZO). According to at least one example embodiment of the invention the metal is provided as an ink where the metal is provided as nanoparticles, e.g. nano-spheres or nano-rods. According to at least one example embodiment of the present invention, the electrode may comprise one or more layers. For example, the electrode may be an ITO/metal/ITO (IMI) electrode comprising a first layer of ITO, a second layer of metal and a third layer of ITO. The electrode may for example comprise ITO/Ag/ITO. The electrode material may be the same electrode material as for the plurality of the first or second electrodes or it may be a different electrode material.

According to at least one example embodiment of the present invention the continuous or discontinuous active layer or the first and the second continuous or discontinuous active layer may comprise a compound which absorbs wavelengths within the range of 250 to 1050, such as e.g. in the range of 350-950 nm, it may for example absorb light within the visual spectrum, i.e. wavelengths within a range from 400 nm to 700 nm. Moreover, said compound shall be able to provide charges due to that absorption of light, or alternatively provide a photovoltage due to that absorption of light. Thus, the continuous or discontinuous active layer may be referred to as a photovoltaic layer. According to at least one example embodiment, the continuous or discontinuous active layer has an efficiency of at least 0.001 electron-hole pairs per absorbed photon, or at least 0.1 electron-hole pairs per absorbed photon, or more preferably at least 0.7 electron-hole pairs per absorbed photon.

According to at least one example embodiment, a continuous active layer may be an active layer that covers both the plurality gaps between electrodes and the plurality of first or second electrodes in both the x-direction and the z-direction such that the photo active area, i.e. the area where light is absorbed, of the solar cell module is increased. Moreover, the first continuous active layer may cover both the plurality of first electrodes and the plurality of gaps between those electrodes. In the same manner, the second continuous active layer may cover both the plurality of second electrodes and the plurality of gaps in between those. In other words, the continuous active layer or the first and the second continuous active layer may be provided globally over the plurality of first and second electrodes and gaps between each of the plurality of first and second electrodes. According to at least one example embodiment the continuous active layer or the first and/or the second continuous active layer may be an organic active layer and may comprise a donor material and/or an acceptor material.

According to at least one example embodiment, a discontinuous active layer may comprise a plurality of layer segments wherein each layer segment is an active layer that cover only an electrode, or only a portion of the electrode, at least in the x-direction. In the z-direction, each layer segment preferably covers the whole electrode, or said portion of the electrode. In other words, the layer segments are separate, in the x-direction, by layer segment gaps. Thus, the first active layer may be a first discontinuous active layer which cover the electrodes in said plurality of first electrodes, or at least a portion of each electrode in the plurality of first electrodes, and which first discontinuous active layer comprises first layer segments separate by first layer segment gaps. According to at least one example embodiment, the plurality of gaps between the electrodes in the plurality of first electrodes are not covered by the first discontinuous active layer. In the same manner, the second active layer may be a second discontinuous active layer which cover the electrodes in said plurality of second electrodes, or at least a portion of each electrode in the plurality of second electrodes, and which second discontinuous active layer comprises second layer segments separate by second layer segment gaps. According to at least one example embodiment, the plurality of gaps between the electrodes in the plurality of second electrodes are not covered by the second discontinuous active layer.

According to at least one example embodiment, a layer segment gap is between 0.01 mm and 1 mm, such as e.g. between 0.05 mm and 0.4 mm, such as e.g. between 0.1 mm and 0.3 mm.

According to at least one example embodiment, the first discontinuous active layer and the second discontinuous active layer are brought into physical contact during the laminating step. For such embodiments, the first discontinuous active layer and the second discontinuous active layer together forms a continuous active layer.

According to at least one example embodiment the discontinuous active layer or the first and/or the second discontinuous active layer may be an organic active layer and may comprise a donor material and/or an acceptor material.

According to at least one example embodiment, for the continuous or discontinuous active layer(s), the donor material may be a semi-conducting polymer or a semi-conducting small organic molecule. The semi-conducting polymer may for example be any semi-conducting polymer and their derivatives, including but not limited to: polythiophenes, polyanilines, polypyrroles, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. The semi-conducting polymer may also be an iso-indigo-based polymer. In more detail, the semi-conducting polymer may for example be: P3HT, PTB7, TQ1, P3TI, PCDTBT, or PffBT4T-20D. The semi-conducting small molecule may for example be a molecule comprising at least one benzodithiophene group, e.g. DRTB-T or BDT3TR. The acceptor material may for example be a semi-conducting polymer or a semi-conducting small molecule. The semi-conducting polymer may for example be N2200 or PNDI-T10. The semi-conducting small organic molecule may for example be a fullerene, a fullerene derivative or any other semi-conducting small molecule such as (5Z,5'Z)-5,5'-{(9,9-dioctyl-9H-fluorene-2,7-diyl)bis[2,1,3-benzothiadiazole-7,4-diyl(Z)methylylidene]}bis(3-ethyl-2-thioxo-1,3-thiazolidin-4-one) (FBR), or 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene) (ITIC). The fullerene derivative may be the phenyl-$C_{61}$-butyric acid methyl ester ($PC_{61}BM$), the phenyl-$C_{71}$-butyric acid methyl ester ($PC_{71}BM$), the indene-$C_{60}$-bisadduct (ICBA), O-IDTBR or IC-C6IDT-IC.

According to at least one example embodiment of the invention, the continuous or discontinuous active layer(s) may comprise between 0.1 wt % and 90 wt % of polymers with a high band gap, such as e.g. between 30 wt % and 50 wt % of such polymers. Polymers with a high a bandgap corresponds to an absorption onset of <250 nm or <350 nm or <450 nm, or alternatively expressed as an optical absorption onset of >5 eV or >4 eV or >3 eV. Hereby, the stability, and/or the self-adhesive properties, of the continuous or discontinuous active layer(s) are improved.

According to at least one example embodiment of the invention, the mixture of a donor and an acceptor material may be provided as a bulk-heterojunction.

According to at least one example embodiment of the invention the organic active layer may comprise one or several organic compounds. For example, the active layer may comprise one, two, three or more organic compounds. Hence, the organic active layer may comprise one donor material and one acceptor material or the organic active layer may comprise two donor materials and one acceptor material or vice versa. Additionally, or alternatively, the active layer may consist of one acceptor material or one donor material disregarding contaminations or traces of substances. Additionally, or alternatively the organic active layer to 98 wt % solely consist of one or several organic compounds including contaminations and traces.

According to at least one example embodiment of the invention the continuous or discontinuous active layer(s) may comprise the same composition throughout the layer and/or the same thickness throughout the layer. It shall be understood that with the same composition and/or the same thickness it means that the composition and/or thickness may vary throughout the layer due to natural variations in the printing process.

According to at least another example embodiment of the invention the composition and/or the thickness of the continuous or discontinuous active layer(s) may vary across the x-z-plane of the solar cell module. Hence, the composition of the active layer covering an anode part may be different for the composition of the active layer covering a cathode part. For example, an anode part may be covered by a mixture, e.g. a bulk-heterojunction, comprising a donor material and an acceptor material whereas a cathode part may be covered only by an acceptor material or only by a donor material. Alternatively, an anode part may be covered by a first mixture, e.g. a bulk-heterojunction, of a first donor material and a first acceptor material whereas a cathode part may be covered by a second mixture, e.g. a bulk-heterojunction of a second donor material and a second acceptor material. According to at least one example embodiment, a cathode part may be covered by a mixture, e.g. a bulk-heterojunction, comprising a donor material and an acceptor material whereas an anode part may be covered only by an acceptor material or only by a donor material. According to at least one example embodiment, a modification layer, which may be an electron transport layer or a hole transport or hole blocking layer (described further below) comprised in the respective electrode, may form the cathode part of each electrode. For such embodiments, the modification layer may be arranged between the mixture of the donor material and the acceptor material covering the cathode part, and the remaining part of the electrode. Moreover, the acceptor material or donor material covering the anode part may be arranged in the x-z plane parallel to, or adjacent to, the modification layer.

According to at least one example embodiment of the invention, the different compositions of the active layer may be deposited as stripes which after deposition forms a continuous active layer covering the plurality of first and/or second electrodes. Moreover, the different compositions of the active layer may be deposited as stripes which after deposition form a discontinuous active layer covering the electrodes in the plurality of first and/or second electrodes.

According to at least one example embodiment, the stripes may after deposition together form a continuous or discontinuous active layer. In other words, the continuous or discontinuous active layer(s) may be referred to as active layer(s) during, and prior to, the step of depositing the active layer(s). Moreover, when forming a continuous active layer, the continuity may be accomplished during, or after, deposition of the active layer(s). According to at least one example embodiment of the invention, the different compositions of the active layer may be deposited as stripes which after the step of laminating together forms a continuous or discontinuous active layer covering the plurality of first and/or second electrodes. According to at least one example embodiment of the invention, a first type of stripes with e.g. the mixture of donor material and acceptor material is deposit on the cathode parts of said plurality of first electrodes and/or said plurality of second electrodes. For embodiments which the cathode parts are covered with a modification layer, which may be an electron transport layer or a hole blocking layer, the first type of stripes are deposited on that modification layer. Furthermore, a second type of stripes with e.g. acceptor material or donor material are deposit on the anode part of said plurality of first electrodes and/or said plurality of second electrodes. Thus, deposition of stripes of first and second types of active layer may be carried out on cathode parts and anode parts of the electrodes of said plurality of first electrodes and/or said plurality of second electrodes. Thus, stripes of the first and second types of the active layer will form the continuous or discontinuous active layer covering the plurality of first and/or second electrodes.

According to at least one example embodiment of the present invention said first or said second continuous or discontinuous active layer may be a hybrid active layer comprising one semi-conducting organic compound and an inorganic compound. The inorganic compound may e.g. be a perovskite material. Additionally, or alternatively, the inorganic compound may be nanoparticles, nanorods or quantum dots of e.g. PbS, CdSe or a metal oxide, e.g. zinc oxide or titanium oxide.

According to at least one example embodiment of the present invention both the first and the second continuous or discontinuous active layer may be an organic active layer. In such embodiments, the first and the second continuous or discontinuous active layer may be the same or they may differ from each other. For example, the first continuous or discontinuous active layer may comprise both a donor material and an acceptor material, whereas the second active layer may comprise solely an acceptor material. Moreover, the first active layer may comprise the same or different donor material and/or acceptor material as compared to the second active layer. Additionally, or alternatively, the ratio between the donor material and the acceptor material may be the same or they may differ in the first and the second active layer.

According to at least one example embodiment of the present invention the depositing of the continuous or discontinuous active layer or of the first and the second continuous or discontinuous active layers may be done by a variety of deposition techniques, for example they may be deposited by means of evaporation, spray-coating, printing or coating. Printing may for example be screen printing, gravure printing or flexographic printing. Coating may for example be slot-die coating or doctor-blade coating. The first and the second continuous or discontinuous active layer may be deposited by the same technique or they may be deposited using different techniques.

According to at least one example embodiment of the invention, the active layer(s) may be deposit from a solvent or a mixture of solvents. The solvent(s) may be chosen from a list comprising but not limited to: xylene, ortho-xylene, toluene, tetraline, chloroform, chlorobenzene, dichlorobenzene, ortho-dichlorobenzene, para-anisaldehyde.

According to at least one example embodiment of the present invention the first and the second substrate portion may be provided as one piece of substrate through the steps of providing a plurality of first and second electrodes and depositing the continuous or discontinuous active layer or the first and the second continuous or discontinuous active layer. The method will then further comprise a step of folding said one piece of substrate such that a first and an opposite second substrate portion is formed, or cutting said one piece of substrate into a first and a second substrate portion prior to the step of laminating. According to at least another example embodiment of the present invention the first and the second substrate portions may be separated through all steps of the method.

According to at least one example embodiment of the invention the step of laminating is done in a roll-to-roll process with one or several lamination rollers. The lamination roller may apply both heat and pressure. The lamination may for example be done through a nip between two heated lamination rollers such that heat and pressure is applied as the first and the second substrate portions are passes through the nip. According to at least one example embodiment, the lamination may be done through several nips, where each nip is between heated lamination rollers.

According to at least one example embodiment of the present invention the method further comprises the step of:
providing each of said plurality of first electrodes and each of said plurality of second electrodes with an anode part and a cathode part by providing a modification layer on each of the plurality of first electrodes and/or on the plurality of second electrodes which partially covers each of said plurality of first electrodes and/or said plurality of second electrodes. The modification layer is deposited before the step of depositing an active layer. This provides a solar cell module where all the individual solar cells are connected in series in a W-type series connection. When aligning the first and second substrate portion prior to lamination it is preferred that two opposite anode parts do not cover each other, i.e. it is preferred that two anode parts do not facing each other. In other words, it is preferred that an anode part of one of the plurality of first electrodes is covered in the x-direction by a cathode part of one of the plurality of second electrodes or vice versa. In other words, an anode part of one of the plurality of first electrodes is facing a cathode part of one of the plurality of second electrodes. Stated differently, an anode part of one of the plurality of first electrodes is covered in a plane extending in the x-z direction by a cathode part of one of the plurality of second electrodes or vice versa.

According to at least one example embodiment of the present invention the modification layer may be an electron transport layer or a hole transport layer. For example, when the electrode material is a conducting polymer e.g. PEDOT:PSS, each of the plurality of first and second electrodes may be provided by an anode part and a cathode part by depositing an electron transport layer partially covering each of the plurality of first and second electrodes. The electron transport layer covers the part of each of the plurality of first and/or second electrodes being the cathode part and provides the electrodes with hole blocking properties.

According to at least one example embodiment of the present invention the electron transport layer may comprise a metal oxide, a nitrogen-containing compound, a phosphorus-containing compound, a sulfur-containing compound, and combinations thereof. The metal oxide may be for example zinc oxide (ZnO), titanium oxide (TiO) or chromium oxide (CrO). A nitrogen-containing compound may for example be an amine or imine containing compound, for example be polyethylene imine (PEI), ethoxylated polyethylene imine (PEIE) or histidine. The electron transport layer may for example comprise a mixture of PEI and a metal oxide. Additionally, or alternatively, the electron transport layer may comprise two or more sublayers. For example, the electron transport layer may comprise a first sublayer comprising an amine or imine containing compound and a second sublayer comprising a metal oxide.

According to at least one example embodiment of the present invention the hole transport layer may comprise a conducting polymer, a metal oxide or a combination of the same. The conducting polymer may for example be PEDOT:PSS. The metal oxides may for example be tungsten oxide ($WO_3$), molybdenum oxide ($MO_x$) or vanadium oxide ($V_2O_5$).

According to at least one example embodiment of the present invention each of the plurality of first and second electrodes are provided by an anode by depositing a hole transport layer partially covering each of the plurality of first and second electrodes and by a cathode part by depositing an electron transport layer partially covering each of the plurality of first and second electrodes. For example, when the electrode material being a metal, or a metal oxide or a combination thereof, each of the plurality of first and second electrodes may be provided by an anode part and a cathode part by depositing a hole transport layer on one part of each of the plurality of first and second electrodes and an electron transport layer on another part of each of the plurality of first and second electrodes. The electron and hole transport layers may be deposited simultaneously or subsequently.

According to at least one example embodiment of the present invention, the step of laminating by means of heat and pressure is performed at a temperature within the range of 50-300° C., or preferably within the range of 50-200, or more preferably within the range of 100-140° C. Additionally, or alternatively, the step of laminating by means of heat and pressure is performed at a temperature of at least 50° C., or at least 100° C., or at least 130° C., or at least 150° C., or at least 200° C. Additionally, or alternatively, the step of laminating by means of heat and pressure is performed at a temperature lower 300° C., or lower than 250° C., or lower than 200° C., or lower than 150° C.

According to at least one example embodiment of the invention the step of laminating by means of heat at pressure is performed at a pressure within the range of 1-50 bar, or more preferably within the range of 3-10 bar. Additionally, or alternatively, the pressure is above 1 bar, or above 2 bar, or above 3 bar, or above 5 bar. Additionally, or alternatively, the pressure is less than 50 bar, or less than 30 bar, or less than 20 bar, or less than 15 bar, or less than 10 bar.

According to a least one example embodiment of the present invention, the step of depositing the active layer or the first and second active layers is done by means of roll-to-roll coating. Roll-to-roll coating may be done with a variety of techniques, for example but not limited to slot-die coating, doctor blading coating, gravure coating, reverse gravure coating or rotary screen printing.

According to a fourth aspect of the present invention, a solar cell module comprising solar cells electrically connected in series is provided. The solar cell module comprises:
- a first flexible substrate portion comprising a plurality of first electrodes spatially separated from each other which separation forms a plurality of gaps between said first electrodes, wherein said first flexible substrate portion is suitable for roll-to-roll deposition;
- a second flexible substrate portion comprising a plurality of second electrodes spatially separated from each other which separation forms a plurality of gaps between said second electrodes, wherein said second flexible substrate portion is suitable for roll-to-roll deposition;
- a first continuous or discontinuous active layer covering said plurality of first electrodes wherein said first active layer is in electrical contact with said plurality of first electrodes and said plurality of second electrodes;
- a second continuous or discontinuous active layer covering said plurality of second electrodes wherein said second active layer is in electrical contact with said plurality of first electrodes and said plurality of second electrodes;
- wherein at least one of said first and second continuous or discontinuous active layers is an organic active layer; and
- wherein said first and second continuous or discontinuous active layers are heat laminated into physical contact; and
- wherein said plurality of first electrodes is arranged off-set of said plurality of second electrodes such that each of said plurality of gaps between said plurality of second electrodes are fully covered by respective one of said plurality of first electrodes.

Effects and features of this fourth aspect of the present invention are largely analogous to those described above in connection with the first, second and third aspects of the present invention. Embodiments mentioned in relation to the first, second and third aspects of the present invention are most compatible with the fourth aspect of the invention. Furthermore, embodiments mentioned below in relation to the fourth aspect are largely compatible with the first, second or third aspect.

It shall be understood that the expression "heat laminated" means that during fabrication of the solar cell module the first and the second active layer are brought into physical contact with and attached to each other by lamination using heat and pressure. Hence, the lamination is performed at an elevated temperature.

Compared to other processes than heat lamination, e.g. sequentially coating or printing, an adhesive layer is needed to attach e.g. the top substrate to the solar cell stack. As the solar cell module according to the fourth aspect of the invention has been manufactured by heat lamination of the first and second continuous or discontinuous active layers, no such adhesive layer is needed. In more detail, the solar cell module has been manufactured by that the first substrate with said plurality of first electrodes and said first continuous or discontinuous active layer, has been faced towards the second substrate with said plurality of second electrodes and said second continuous or discontinuous active layer, and thus has been attached to each other by the first and second continuous or discontinuous active layers. Hence, for the solar cell module according to the fourth aspect of the invention, no separate adhesive layer is present between any of the layers. Moreover, compared to solar cell modules manufactured by sequentially coating or printing, a delamination of the layers can result in a break in the cell, which typically occurs between the active layer and the electrodes, while for the solar cell module of the fourth aspect of the invention, for which said first and second continuous or discontinuous active layers are heat laminated into physical contact, a break in the cell typically occurs between said first and second continuous or discontinuous active layers.

According to at least one example embodiment of the present invention, the first and second continuous or discontinuous active layers are heat laminated into physical contact at a temperature within the range of 50-300° C., or preferably within the range of 50-200° C. more preferably within the range of 100-140° C. Additionally, or alternatively, the step of laminating by means of heat and pressure is performed at a temperature of at least 50° C., or at least 100° C., or at least 130° C., or at least 150° C., or at least 200° C.

Additionally, or alternatively, the step of laminating by means of heat and pressure is performed at a temperature lower 300° C., or lower than 250° C., or lower than 200° C., or lower than 150° C.

According to at least one example embodiment of the invention there may be one or several solar cells modules printed after each other on the same continuous substrate. The continuous substrate may comprise one or several substrate portions.

According to at least one example embodiment of the present invention, both the first and said second active layer is an organic active layer comprising at least a conducting organic compound;
wherein the semi-conducting organic compound is the same in said first and said second active layer; or
wherein the semi-conducting organic compound is different in said first and said second active layer.

According to at least one example embodiment of the invention the organic active layer may comprise one or several organic compounds. For example, the active layer may comprise one, two, three or more organic compounds. Hence, the organic active layer may comprise one donor material and one acceptor material or the organic active layer may comprise two donor materials and one acceptor material or vice versa. Additionally, or alternatively, the active layer may consist of one acceptor material or one donor material disregarding contaminations or traces of substances.

According to at least one example embodiment of the present invention, the plurality of first electrodes and said plurality of second electrodes are semi-transparent electrodes.

According to at least one example embodiment of the present invention both the plurality of first electrodes and the plurality of second are semi-transparent.

According to at least one example embodiment of the present invention said semi-transparent electrodes comprises a metal oxide, a conducting organic compound or the combination thereof. The conducting organic compound may for example be a conducting organic small molecule or a conducting polymer. For example, the conducting polymer may for example be PEDOT:PSS or variants thereof, e.g. PEDOT:PSS PH1000. The metal oxide may for example be indium tin oxide (ITO) or aluminium zinc oxide (AZO).

According to at least one example embodiment of the present invention, the plurality of first electrodes or said plurality of second electrodes metal electrodes. Hence, either the plurality of first electrodes or the plurality of second electrodes may be opaque.

According to at least one example embodiment the metal may be chosen from a list comprising but not limited to: aluminium (Al), chromium (Cr), titanium (Ti), cupper (Cu), gold (Au) and silver (Ag).

According to at least one example embodiment of the present invention, the first and/or second substrate portion comprises a partially or fully transparent polymer film with a thickness within the range of 1-1000 μm, or more preferably 30-150 μm. Having a polymer film with a thickness within the range of 1-1000 μm provides a desired stiffness to the solar cell module. A thicker substrate may provide a stiffer solar cell module.

According to at least one example embodiment of the present invention the first and/or second substrate portion may comprise a UV-blocking layer. Additionally, or alternatively the first and/or second substrate portion may comprise an oxygen and/or water vapor barrier.

According to at least one example embodiment of the present invention, the plurality of first electrodes and/or said plurality of second electrodes are partially covered by a modification layer. The modification layer may be for example an electron transport layer or a hole transport layer. The modification layer divides each of the plurality of first electrodes and/or each of the plurality of second electrodes into an anode part and a cathode part.

According to at least one example embodiment the plurality of said first electrodes and/or the plurality of second electrodes may be covered by both an electron transport layer and a hole transport layer.

According to at least one example embodiment, the modification layer comprises a thickness within the range of 1-200 nm, or within the range of 3-100 nm, or within the range of 5-50 nm.

According to at least one example embodiment of the invention the modification layer may comprise one or several sub-layers.

According to at least one example embodiment of the present invention, the solar cell module comprises an active area, and wherein said active area covers at least 20%, or at least 40%, or at least 60%, or at least 80%, or at least 90%, or at least 95% of the surface area of said first and/or second substrate portion. The active area being the combined active area of each of the solar cells which are connected in series in the solar cell module.

It shall be understood that each pair of an anode part of a first electrode and an opposite cathode part of a second electrode, i.e. a cathode part covering said anode part in the y-direction, together with the first and second continuous or discontinuous active layer arranged between the anode part and the cathode part forms one solar cell. Likewise, each pair of a cathode part of a first electrode and an opposite anode part of a second electrode, i.e. the anode part covering said cathode part in the y-direction, together with the first and second continuous or discontinuous layer arranged between the cathode part and the anode part forms one solar cell. The active area of such a solar cell is the width of the solar cell, i.e. the width of an anode part covered by a cathode part multiplied with the length of said anode part covered by said cathode part.

According to at least one example embodiment of the present invention, the thickness of said plurality of first and said plurality of second electrodes is in the range of 20-2000 nm, more preferably between 50-300 nm. Additionally, or alternatively, the thickness of the plurality of first and second electrodes is at least 20 nm, or at least 30 nm, or at least 50 nm, or at least 75 nm, or at least 100 nm, or at least 300 nm. Additionally, or alternatively, the thickness of the plurality of first and second electrodes is less than 2000 nm, or less than 100 nm, or less than 750 nm, or less than 500 nm, or less than 300 nm, or less than 200 nm. The thickness of the pluralities of first and second electrodes is chosen such that the resistance is balanced with transparency to an optimal combination of performance and aesthetics of the solar cell module depending on area of use.

According to at least one example embodiment of the present invention, the combined thickness of said first and said second continuous or discontinuous active layer is in the range of 30-1000 nm, more preferably between 80-350 nm. In other words, the thickness of the first continuous or discontinuous active layer plus the thickness of the second continuous or discontinuous active layer is in the range of 30-1000 nm, or more preferably between 80-350 nm. Additionally, or alternatively, the combined thickness of the first and second continuous or discontinuous active layers is at least 30 nm, or at least 50 nm, or at least 80 nm, or at least 90 nm, or at least 100 nm, or at least 150 nm. Additionally, or alternatively, the combined thickness of the first and second continuous or discontinuous active layer is less than 1000 nm, or less than 800 nm, or less than 500 nm, or less than 350 nm, or less than 250 nm, or less than 200 nm. The thickness of the first and second continuous or discontinuous active layer is chosen such to maximise the light absorption while still allowing for charge transport to the electrodes. It shall be understood that the mentioned thickness is the combined thickness of the first and second continuous or discontinuous active layers together after drying.

According to at least one example embodiment of the invention the first and the second active layer may be of the same thickness. In other words, the thickness of the first active layer is half of the combined thickness and the thickness of the second active layer constitutes the other half of the combined thickness. According to at least another embodiment of the present invention the thickness of the first and the second active layer differs from each other.

According to at least one example embodiment, the solar cell module may be referred to as a PV-cell module or a photovoltaics device. The solar cell module may also be referred to as a light harvesting module, as solar energy, as well as other light sources, such as low light sources or indoor lights, may be used to create the electricity.

BRIEF DESCRIPTION OF THE DRAWINGS

The above objects, as well as additional objects, features and advantages of the present invention, will be more fully appreciated by reference to the following illustrative and non-limiting detailed description of embodiments of the present invention, when taken in conjunction with the accompanying drawings, wherein.

DETAILED DESCRIPTION OF THE DRAWINGS

In the present detailed description, embodiments of the present invention will be discussed with the accompanying figures. It should be noted that this by no means limits the scope of the invention, which is also applicable in other circumstances for instance with other types or variants of methods for laminating a solar cell module or other types or variants of solar cell module than the embodiments shown in the appended drawings. Further, that specific features are mentioned in connection to an embodiment of the invention does not mean that those components cannot be used to an advantage together with other embodiments of the invention.

Figure 1:
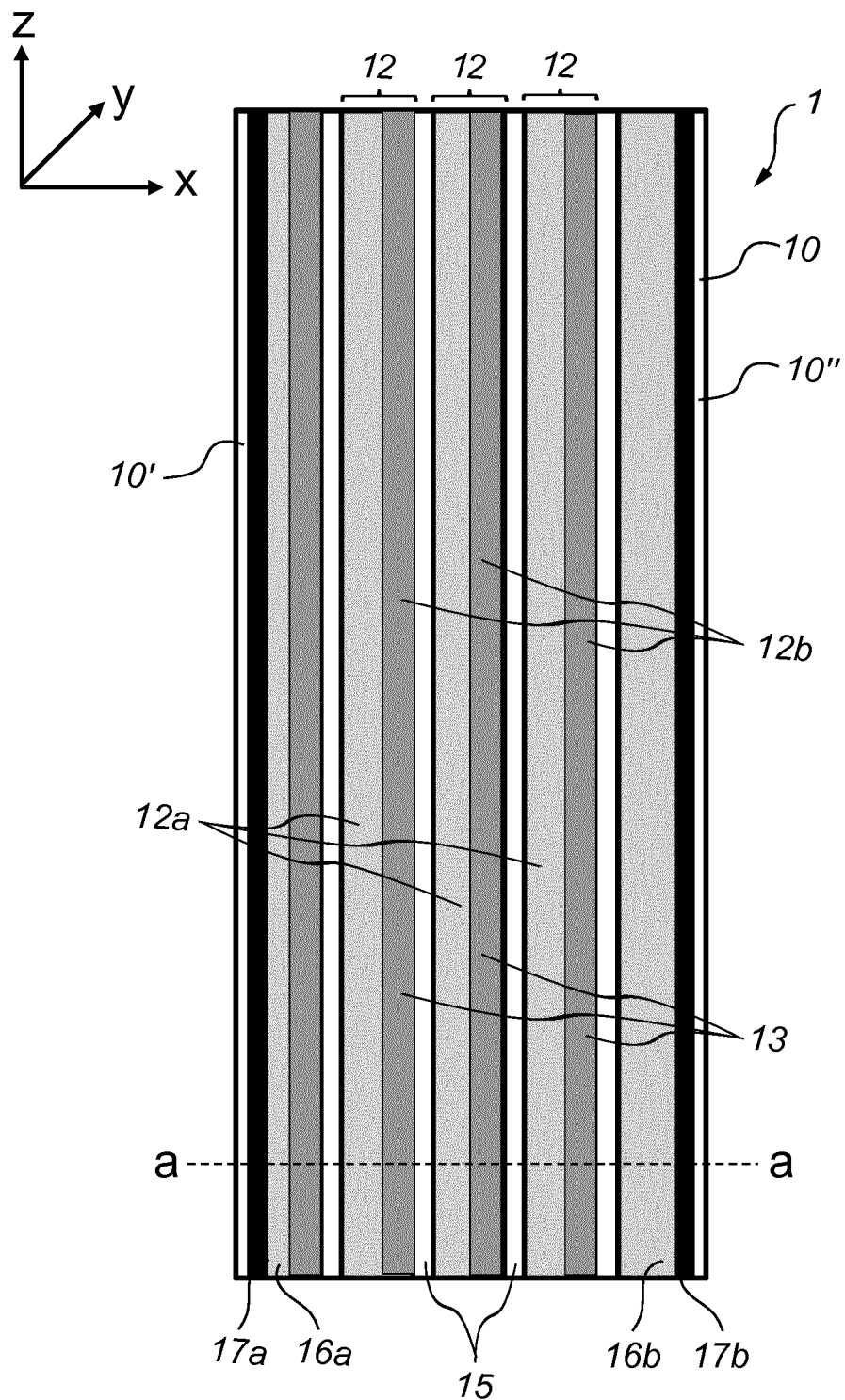
FIG. 1 shows a schematic and cross-sectional view of a solar cell module in accordance with at least one embodiment of the invention.
Figure 2:
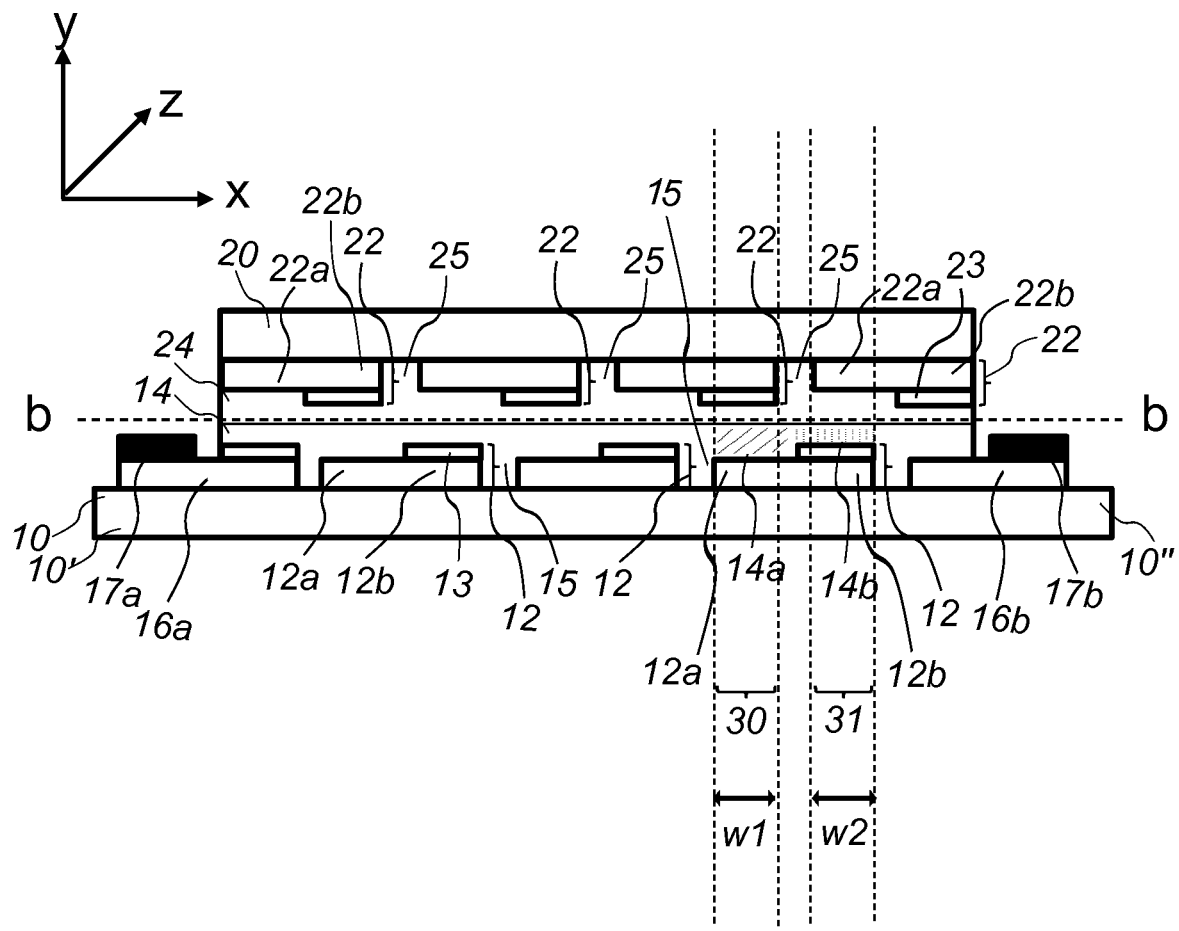
FIG. 2 shows a schematic and cross-sectional view of the solar cell module in FIG. 1 in accordance with at least one embodiment of the invention.

FIG. 1 and FIG. 2 shows schematic views of a solar cell module 1. FIG. 1 shows a cross-sectional, top view of the solar cell module 1. FIG. 2 shows a cross-sectional view of the same solar cell module 1, where the cross-section is taken along the dashed line a-a in FIG. 1. The cross-section shown in FIG. 1 is taken along the dashed line b-b in FIG. 2. Hence, the cross-section shown in FIG. 1 corresponds to the bottom half of the cross-section shown in FIG. 2. FIG. 1 and FIG. 2 include a coordinate system, showing x-, y- and z-direction. This coordinate system is used for describing and visualizing the solar cell module 1 and the directions or extensions of the different components of the solar cell module. The following description will use terms such as "top", "bottom", "outer" etc. These terms generally refer to the views and orientations as shown in the drawings. The terms are used for the reader's convenience only and shall not be limiting. The solar cell module of FIGS. 1 and 2 is a w-type series connected solar cell module.

As shown in FIGS. 1 and 2, the solar cell module 1 comprises a first flexible substrate portion 10 on which a plurality of first electrodes 12 is arranged as well as a first continuous active layer 14 (not visible in FIG. 1). The first substrate portion 10 may be transparent or semi-transparent. The first substrate portion 10 as well as the first plurality of electrodes 12 are suitable for roll-to-roll processing methods, e.g. roll-to-roll printing, roll-to-roll coating and roll-to-roll lamination.

The plurality of the first electrodes 12 comprises a first modification layer 13. The first modification layer 13 is arranged such that it divides each of the plurality of the first electrodes into an anode part 12a and a cathode part 12b. Here, the modification layer 13 covers a portion of 12 and enables electron extraction properties for a part of each plurality of first electrodes 12 which then constitutes the cathode part 12b of each plurality of electrodes. Here, the first modification layer 13 is an electron transport layer which enables hole blocking properties as well as electron extraction properties for this part of the electrode 12b. The cross-section of the solar cell module 1 shown in FIG. 1 further comprises a first and second contacting electrode 16a,16b optionally comprising a respective first and a second busbar 17a,17b or contacting points.

The plurality of first electrodes 12 are provided as substantially parallel stripes on the first substrate portion 10. The plurality of first electrodes 12 extends along the substrate in the z-direction. In other words, the longest extension of the stripes will here be in the z-direction. As shown in FIG. 1, the longest extension of the first substrate portion 10 and the plurality of first electrodes 12 is here the same direction. The plurality of first electrodes 12 is arranged such that they are spatially separated from each other in a x-direction, which separation forms a plurality of gaps 15 between said first electrodes 12. In an alternative embodiment, the longest extension of the stripes may be in a direction transverse or orthogonal to the longest extension of the substrate. In more detail, when the longest extension of the substrate is in the z-direction, the longest direction of the plurality of first electrodes 12 may be in the x-direction or in any direction between x and z.

The first and the second contacting electrode 16a,16b is here arranged on the first substrate portion 10. The first contacting electrode 16a is here arranged at a first lateral side 10' of the first substrate portion 10 and the second contacting electrode 16b is arranged at second lateral side 10" of the first substrate portion 10. The plurality of first electrodes 12 is arranged spatially between the first and the second contacting electrode 16a,16b as seen in the x-direction. Hence, the first 16a and the second contacting electrode 16b are the outer electrodes. It shall be noted that here, the first and second contacting electrode 16a,16b is not a part of the plurality of the first electrodes 12. In other words, the plurality of first electrodes 12 is the electrodes in between the first 16a and second contacting electrode 16b. Besides serving as the same purpose as the plurality of first electrodes 12, the first 16a and the second contacting electrode 16b are used for connecting the solar cell module to a unit (not shown) for collecting electricity when the solar cell module 1 is in use. The connection is done via the first 17a and second busbar 17b. The first contacting electrode 16a further comprises a modification layer 13. In FIG. 2 the left part of the first contacting electrode 16a and the right part of the second contacting electrode 16b, i.e. the parts of the contacting electrodes which are not covered by the first active layer 14, is used for connecting the solar cell module for collecting electricity. The right part of the first contacting electrode 16a serves the same purpose as a cathode part of one of the plurality of first electrodes 12. The left part of the second contacting electrode 16b serves the same purpose as an anode part of one of the plurality of first electrodes 12.

As seen in FIG. 2, the solar cell module 1 further comprises a second flexible substrate portion 20 having the same configuration as described in relation to the first substrate unless otherwise is stated. In other words, there are a plurality of second electrodes 22 and a second continuous active layer 24. Moreover, the plurality of the second electrodes 22 comprises a second modification layer 23. The second modification layer 23 is arranged such that it divides each of the plurality of the first electrodes into an anode part 22a and a cathode part 22b. Here, the second modification layer 23 is an electron transport layer which enables hole blocking properties as well as electron extraction properties for this part of the electrode 22b. In FIG. 2, there are no contacting electrodes on the second substrate 20.

The plurality of second electrodes 22 are provided as stripes on the second substrate portion 20 and is arranged such that they are spatially separated from each other in the x-direction, which separation forms a plurality of gaps 25 between said second electrodes 22.

The plurality of second electrodes 22 is arranged parallel with the plurality of first electrodes 12 and facing the same. Moreover, the plurality of second electrodes 22 is arranged off-set in the x-direction relative the plurality of first electrodes 12 in the y-direction, such that each of said plurality of gaps 15 between the plurality of first electrodes 12 are fully covered by respective one of the plurality of second electrodes 22. An electrode in one of the sets of electrodes does not cover more than two electrodes in the other set of electrodes. Hence, when looking in the negative y-direction, the plurality of first electrodes 12 will partly be visible through the gaps 25 between the plurality of second electrodes 22. Further, a part of each of the plurality of first electrodes 12 covered by the first modification layer 13 is covered by a part of each of the plurality of the second electrodes 22 which is not being covered by the second modification layer 23. Hence, a cathode part 22b of each of the plurality of second electrodes 22 is arranged opposite and such that it is facing a anode part 12a of each of the plurality of first electrodes 12. Likewise, an anode part 22a of each of the plurality of second electrodes 22 are arranged opposite and such that it is facing a cathode part 12b of each of the plurality of first electrodes 12.

The first continuous active layer 14 is arranged such that it covers the plurality of first electrodes 12 and the second continuous active layer 24 is arranged such that it covers the plurality of second electrodes 22. Moreover, the first and the second continuous active layer 14,24 are sandwiched between the first 10 and the second substrate portions 24. Both, the first 14 and the second active layers 24, are arranged such that they are in electrical contact with both the plurality of first electrodes 12 and the plurality of second electrodes 22. Moreover, the first and second active layer 14,24 are in physical contact to each other. The active layers may be brought into physical contact by roll-to-roll lamination using heat and/or pressure. The first 14 and/or the second continuous active layer 24 is an organic active layer. If either the first 14 or second continuous active layer 24 is not an organic active layer, they may for example be a hybrid active layer comprising both organic and/or inorganic materials. In an alternative embodiment, there is only a one active layer arranged on one of the sets of electrodes. In such an embodiment the active layer may be brought into physical contact with the other set of electrodes by roll-to-roll lamination using heat and/or pressure.

It shall be understood that each pair of one anode part 12a of a first electrode 12 and an opposite cathode part 22b of a second electrode 22, or a cathode part 12b of a first electrode 12 and an opposite anode part 22a of a second electrode 22 together with the first 14 and second continuous active layer 24 there between forms one solar cell. In FIG. 2 $w_1$ and $w_2$ has been added for visualizing two of such solar cells, 30 and 31, which are connected in series through the one of the plurality of first electrodes 12 which they are sharing. The active area of the solar cells 30 is therefore approximately the width w1 times the length of the electrodes in the z-direction. Likewise, the active area of the solar cells 31 is therefore approximately the width w2 between the dashed lines times the length of the electrodes in the z-direction.

In FIG. 2 the active layer 14a covering the anode part of the solar cell 30 is a bulk-heterojunction comprising a donor material and a first acceptor material and the active layer 14b covering the cathode part of the solar cell 31 comprises solely a second acceptor material. Hence, the continuous active layer 14 comprises a donor material, a first and a second acceptor material. Additionally, or alternatively, parts of the second active layer 24 covering 14a and 14b in the y-direction, may have or not have the same composition as 14a or 14b.

It shall be noted that the thickness of the different layers, e.g. the first 14 and the second active layer 24, or the plurality of first 12 or second 22 electrodes have not been drawn to scale.

Figure 3A:
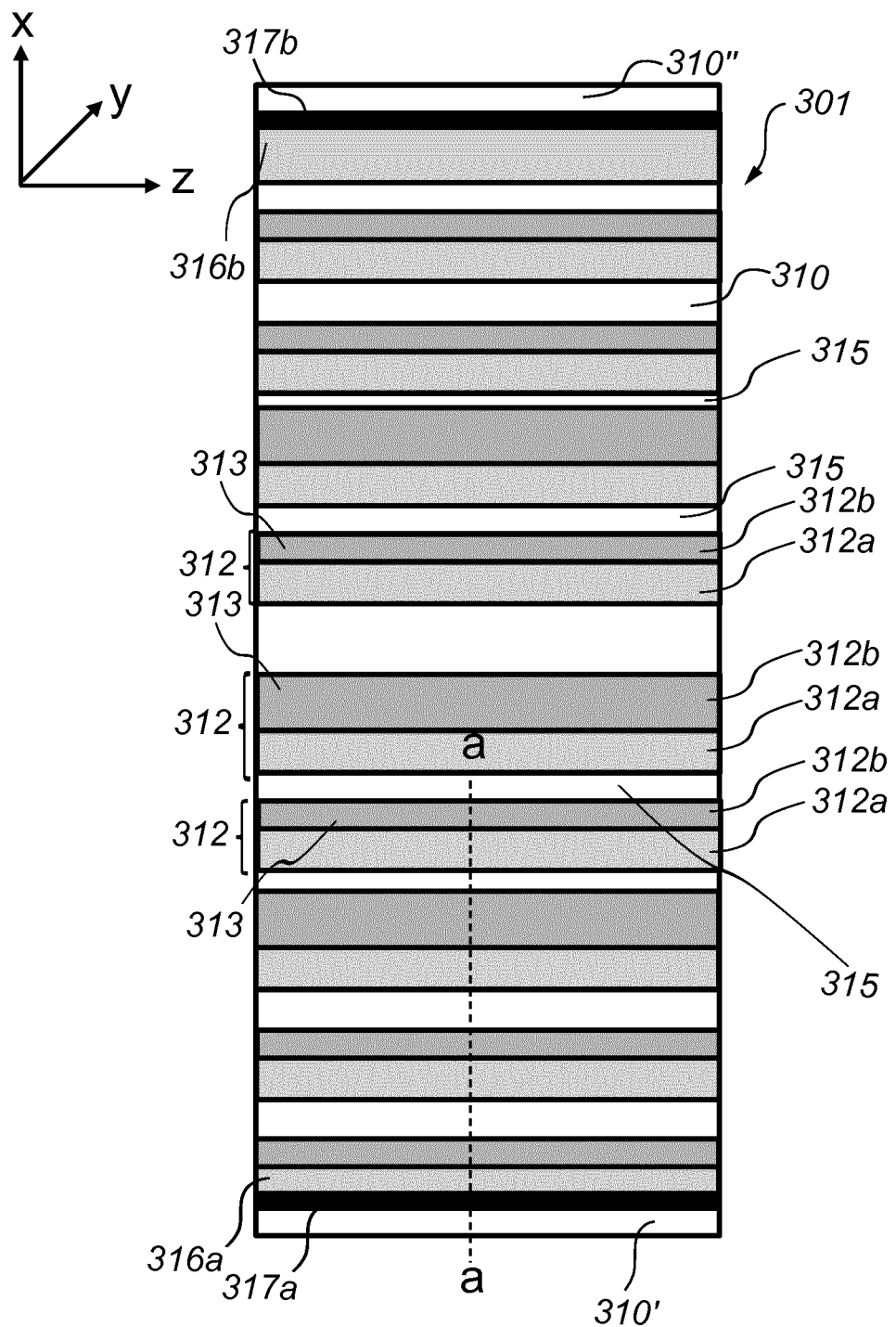
FIGS. 3a and 3b shows a schematic and cross-sectional view of a solar cell module in accordance with at least one embodiment of the invention.
Figure 3B:
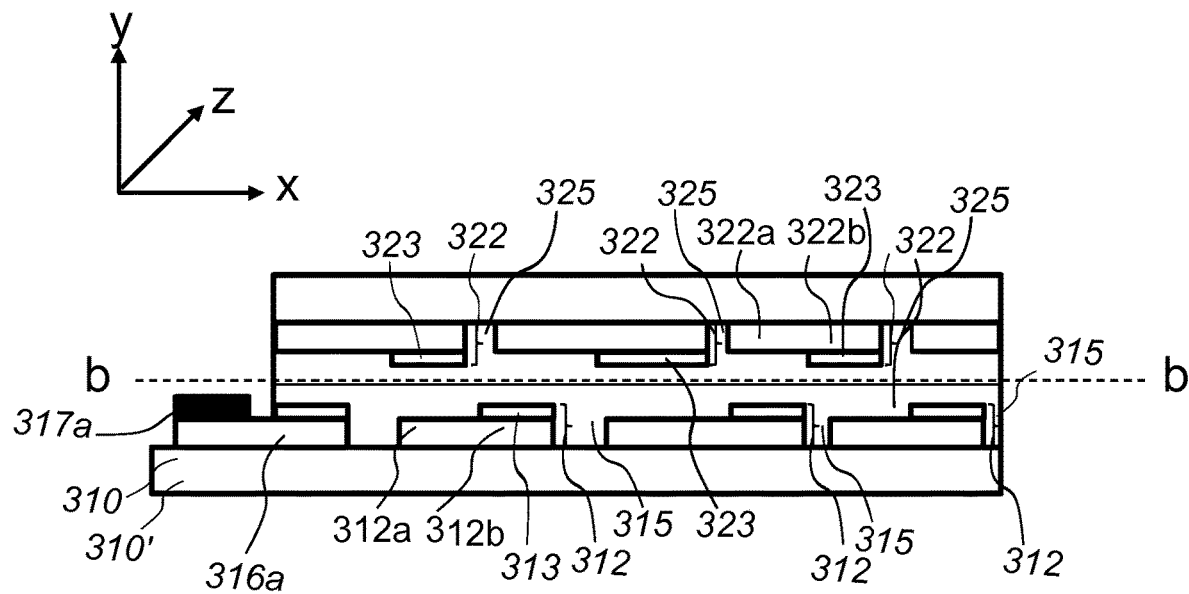

FIG. 3a and FIG. 3b show cross-sectional views of a solar cell module 301. In FIG. 3a the solar cell module is seen in the x-z plane, and FIG. 3b shows a part of the x-y-plane of the solar cell module. In other words, FIG. 3a shows a cross-section taken along the line b-b in FIG. 3b and FIG. 3b shows a cross-section taken along the line a-a in FIG. 3a. The configuration of the solar cell module 301 is the same as described in relation to the solar cell module 1 in FIGS. 1 and 2 (the features are marked by the same reference numerals as in FIGS. 1 and 2, but with the addition of the value "300" in FIG. 3) except for what is stated below.

In FIG. 3, the longest extension of the plurality of first electrodes 312 is not parallel to the longest extension of the first substrate portion 310. The longest extension of the plurality of first electrodes are parallel to the z-direction. Hence, the longest direction of the plurality of first electrodes 312 is perpendicular or orthogonal to the longest direction of the substrate portion 310. In addition, the longest direction of the first and second contacting electrode 316a, 316b as well as the longest direction of the first and second busbar 317a, 317b is parallel to the longest extension of the plurality of first electrodes 312. FIG. 3 shows further that the width in the x-direction of each of the plurality of first electrodes 312 differs from each other as well as the width in the x-direction of the modification layer 313 comprised in each of the plurality of first electrodes 312. Also, the width in the z-direction of each of the gaps 315 between the electrodes 312 differs.

Figure 4:
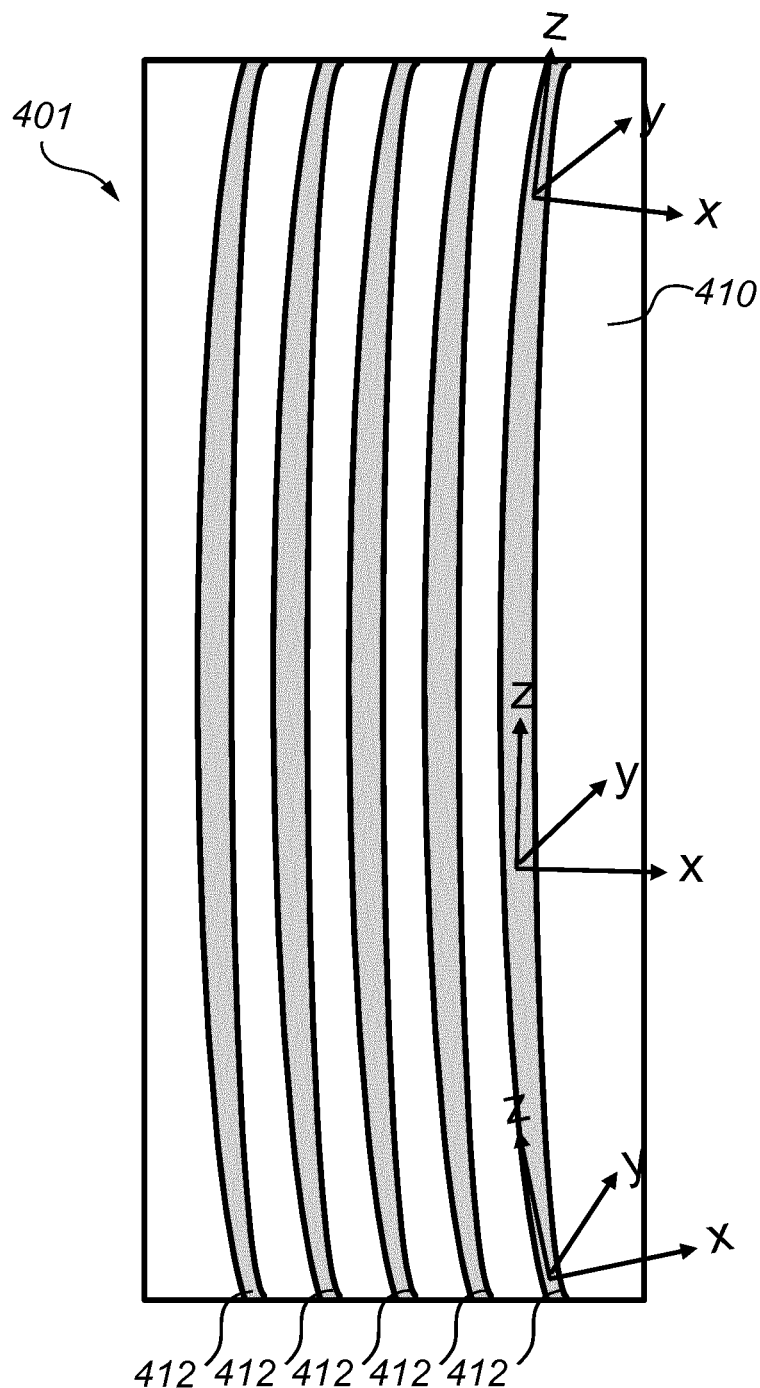
FIG. 4 shows a schematic and cross-sectional view of a solar cell module in accordance with at least one embodiment of the invention.

FIG. 4 shows a cross-section of a solar cell module 401 where the solar cell module is seen in the x-z plane. The configuration of the solar cell module 401 is the same as described in relation to the solar cell module 1 in FIGS. 1 and 2 (the features are marked by the same reference numerals as in FIGS. 1 and 2, but with the addition of the value "400" in FIG. 4) except for what is stated below. FIG. 4 shows only the first substrate portion 410 and the plurality of first electrodes 412. The plurality of first electrodes 412 is slightly curved and the width of each of the plurality of the first electrodes 412 differs along the z-direction of each electrode. The curvature of the electrodes will cause the x-direction to vary along the extension of the electrodes such that the x-direction is orthogonal or perpendicular to the extension of the electrode in every point of the electrode. Hence, the longest extension of the substrate portion may not always be parallel to the z-direction. The stripes of the plurality of first electrodes 412 are still parallel even thought they are slightly curved. It shall be noted that the efficiency of the solar cell module will depend on the width of the electrode being the thinnest (in the x-direction) electrode.

Figure 5:
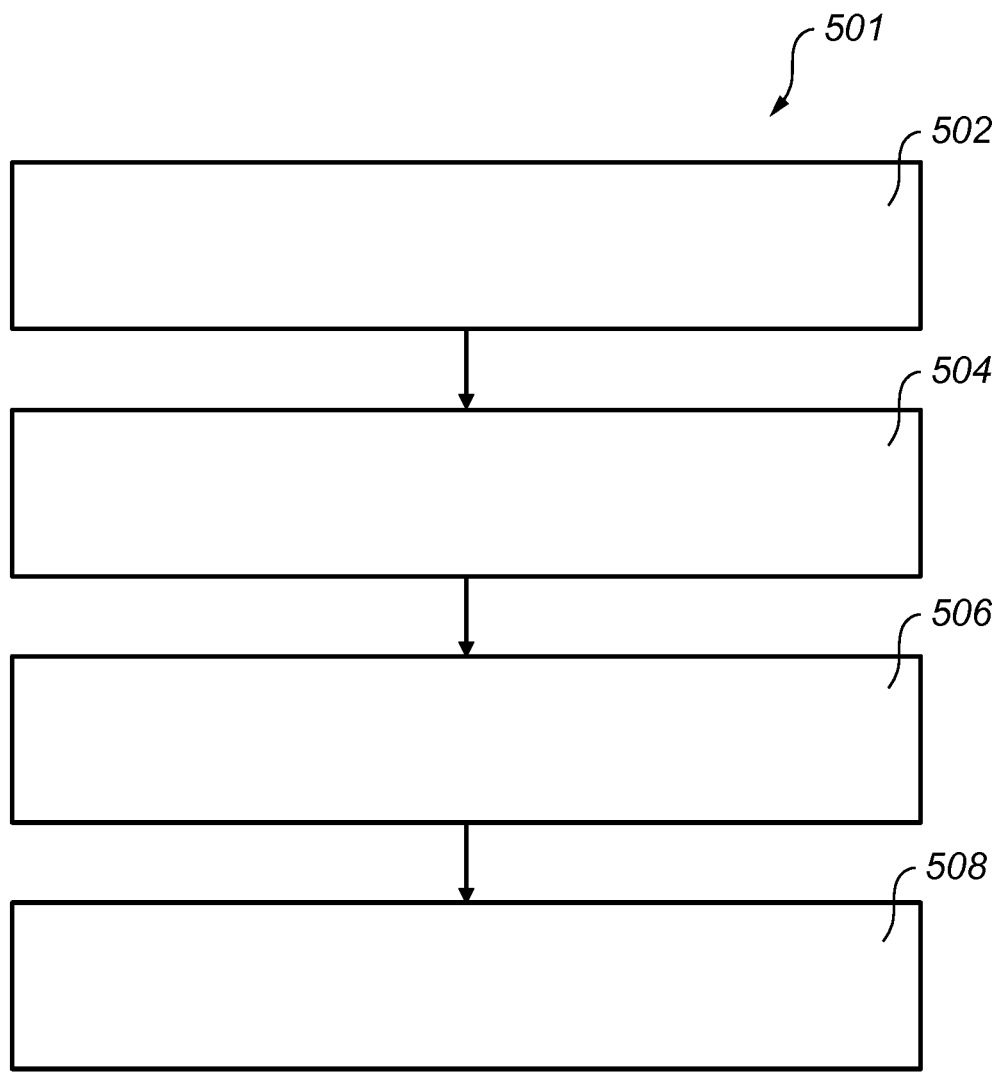
FIG. 5 shows a schematic view of a method for laminating a solar cell module in accordance with at least one embodiment of the invention.

FIG. 5 shows a schematic view of the method 501 for manufacture laminated solar cells modules comprising a plurality of solar cells electrically connected in series. In the first step 502 of the method a first and a second flexible substrate portion suitable for roll-to-roll deposition is provided. In the next step 504 a plurality of first electrodes on top of the first substrate portion and a plurality of second electrodes on top of the second substrate portion is provided. The plurality of first and second electrodes are provided as parallel stripes spatially separated such that a plurality of gaps is formed. The plurality of first and second electrodes may be divided in an anode part and a cathode part by providing a modification layer. The modification layer may be a hole transport layer or an electron transport layer. In a following step 506 a first continuous active layer is deposited on top of the first electrodes and a second continuous active layer is deposited on top of the second electrodes. The first and/or the second continuous active layer is an organic active layer. The first and second substrate portions are in a subsequent step 508 laminated together by means of heat and pressure in a roll-to-roll process. By this lamination the first and the second active layer is brought into physical contact with each other and the first and said second active layer is brought into electrical contact with said plurality of first electrodes and said plurality of second electrodes. Prior to the lamination the plurality of first electrodes 12 has to be aligned to the second electrodes 22. The alignment may for example be done as shown in FIG. 2.

Example

The Following Example Describes a Method for Laminating the Solar Cell Module 1 of FIGS. 1 and 2.

A 300 mm wide and 125 µm thick polyethylene terephthalate (PET) foil (Dupunt Melinex) is provided as the first and second substrate portions 10, 20. Hence, the first and second substrate portions 10, 20 belongs to the same piece of substrate.

PEDOT:PSS PH1000 (Heraeus) with 6 vol % ethylene glycol and 0.5 vol % Capstone FS-30 was slot-die coated in 9 mm wide stripes with 1 mm wide gaps 15 on a 240 mm wide part of the piece of substrate in order to provide the plurality of first and second electrodes 12, 22 as well as the first and second contacting electrode 16a, 16b. The thickness of each of the plurality of first and second electrodes 12, 22 is approximately 200 nm. The length of the plurality of the electrodes is 1000 mm. Subsequently, an approximately 5-10 nm thick polyethyleneimine (PEI) layer was coated from isopropanol in 5 mm wide stripes with 5 mm separation covering half the width of each of the plurality of the first and second electrodes 12, 22 to form an anode part 12a, 22a and a cathode part 12b, 22b of each of the plurality of first and second electrodes 12, 22. Finally, the first and the second continuous active layer 14, 24 is provided on top of respective plurality of first and second electrodes 12, 22. The first and the second active layers may be approximately 100 nm thick and are coated such that they together covers the whole width of the piece of substrate such that it covers all of the plurality of first and second electrodes 12, 22 as well as the gaps 15,25. The continuous active layer comprises a quinoxaline based polymer and a fullerene derivative in a 1:2 ratio (by weight).

Prior to the step of laminating the piece of substrate is cut in two pieces, separating the first and second substrate portions 10, 20 from each other. On the contacting electrodes conductive silver ink or carbon ink is pasted to form the current collecting first and second busbar 17a, 17b. On top of the carbon paste tin-plated cupper tape may be applied to increase the conductivity. The first and the second substrate portions 10, 20 were aligned such that the plurality of first electrodes 12 is arranged off-set the plurality of second electrodes 22 and such a cathode part 22b of each of the plurality of second electrodes 22 is arranged opposite and such that it is facing an anode part 12a of each of the plurality of first electrodes 12 and an anode part 22a of each of the plurality of second electrodes 22 is facing a cathode part 12b of each of the plurality of first electrodes. The first and the second substrate portions 10, 20 is laminated together with the coated surface facing each other using a roll laminator (GSS DH-650S Graphical Solutions Scandinavia AB) with roller temperature at 120° C. and a pressure of approximately 6 MPa. The laminated solar cell module may optionally be coated with a UV-adhesive on both sides and optionally an oxygen/water vapor barrier foil are laminated on one or on both side of the solar cell module and the solar cell module may then be subsequently cured with a UV-lamp.

Figure 6:
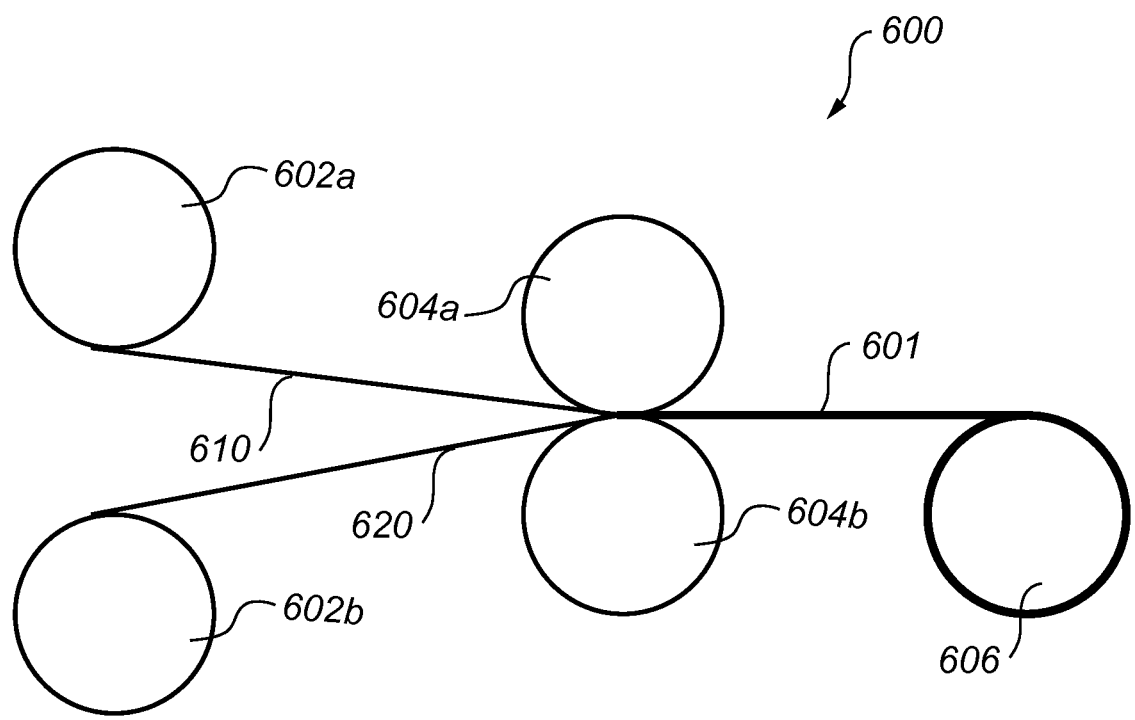
FIG. 6 shows a schematic view of the roll-to-roll lamination in accordance with at least one example embodiment of the invention.

FIG. 6 shows a schematic view of a roll-to-roll lamination process. The first and the second substrate portion 610, 620 comprising respective pluralities of first and second electrodes, as well as a respective first and second continuous active layers is wind up on a first and a second roll 602a, 602b. The first and second substrate portion is aligned such that the plurality of first electrodes is arranged off-set the plurality of second electrodes and such a cathode part of each of the plurality of second electrodes is arranged opposite an anode part of each of the plurality of first electrodes and an anode part of each of the plurality of second electrodes is facing a cathode part of each of the plurality of first electrodes. Subsequently, the first and second substrate portion will be laminated together to a solar cell module 601 in a roll laminator comprising a first and a second laminator roll 604a, 604b. The lamination is provided by means of heat and pressure. The lamination brings the first and the second continuous active layer into physical contact with each other. The solar cell module 601 will be winded up on a roll 606 for storage and/or transportation before usage of the solar cell module 601.

Figure 7A:
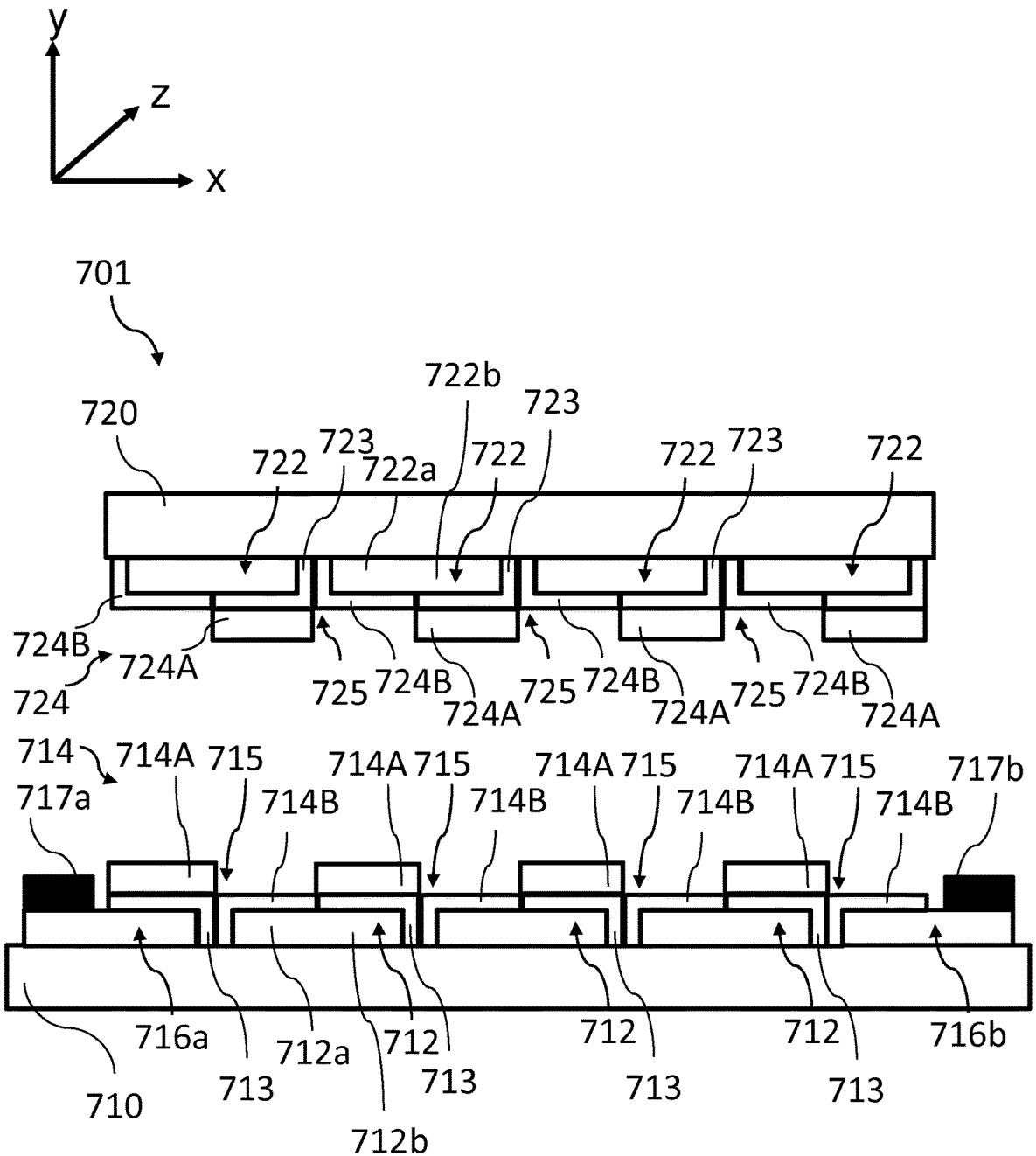
FIG. 7a shows a schematic and cross-sectional view of a solar cell module in accordance with at least one embodiment of the invention.

FIG. 7a shows a cross-sectional view of a part of the x-y-plane of a solar cell module 701. The configuration of the solar cell module 701 is the same as described in relation to the solar cell module 1 in FIGS. 1 and 2 (the features are marked by the same reference numerals as in FIGS. 1 and 2, but with the addition of the value "700" in FIG. 7a) except for what is stated below.

Corresponding to the solar cell module 1 in FIGS. 1 and 2, the solar cell module 701 comprises a first flexible substrate portion 710 on which a plurality of first electrodes 712 is arranged together with a first and second contacting electrode 716a, 716b and first and a second busbar 717a, 717b, respectively. The solar cell module 701 further comprises a second flexible substrate portion 720 on which a plurality of second electrodes 722 is arranged. For clarity reasons, the first substrate portion 710 with its plurality of first electrodes 712 is visualized as being spatially distanced in the y-direction to the second substrate portion 720 with its plurality of second electrodes 722. However, during the step of laminating by means of heat and pressure, the first and said second substrate portions 710, 720, with its respective components, will be brought together.

The plurality of the first electrodes 712 and the plurality of the second electrodes 722 comprises a respective modification layer, i.e. a first modification layer 713 for the plurality of the first electrodes 712 and a second modification layer 723 for the plurality of the second electrodes 722. The first and second modification layers 713, 723 are arranged such to divide each electrode of the plurality of the first and the second electrodes 712, 722 into the respective anode part 712a, 722a, and respective cathode part 712b, 722b (of which only some are indicated in FIG. 7a). In other words, the modification layers 713, 723 cover a respective portion (i.e. the respective cathode part 712b, 722b) of each electrode and enables electron extraction properties and function as an electron transport layer which enables hole blocking properties as well as electron extraction properties for this part of the electrode.

In FIG. 7a, the composition and the thickness of the active layers 714, 724 vary across the x-z-plane of the solar cell module 701. In more detail, the composition of the first active layer 714 (i.e. the active layer covering the plurality of first electrodes 712) covering the anode part 712a is different for the composition of the active layer 714 covering the cathode part 712b (or covering the first modification layer 713 comprised in the electrodes of the plurality of first electrodes 712). Correspondingly, the composition of the second active layer 724 (i.e. the active layer covering the plurality of second electrodes 722) covering the anode part 722a is different for the composition of the active layer 724 covering the cathode part 722b (or covering the second modification layer 723 comprised in the electrodes of the plurality of second electrodes 722). In the embodiment of FIG. 7a, the cathode parts 712b, 722b are covered by a mixture, e.g. a bulk-heterojunction, comprising a donor material and an acceptor material, whereas the anode parts 712a, 722a are covered only by a donor material.

As also seen in FIG. 7a, the plurality of first electrodes 712 is arranged such that they are spatially separated from each other in the x-direction, which separation forms a plurality of gaps 715, or first gaps 715, between the first electrodes 712. Correspondingly, the plurality of second electrodes 722 is arranged such that they are spatially separated from each other in the x-direction, which separation forms a plurality of gaps 725, or second gaps 725, between the second electrodes 722. Moreover, the plurality of second electrodes 722 is arranged parallel (in the y-direction) with the plurality of first electrodes 712 and facing the same, and the plurality of second electrodes 722 is arranged off-set in the x-direction relative the plurality of first electrodes 712, such that each of said plurality of gaps 715 between the plurality of first electrodes 712 are fully covered, as seen along the y-direction, by respective one of the plurality of second electrodes 722. As also seen in FIG. 7a, each one of said gaps 715, 725, is at least partly filled with a portion of one of the modification layers 713, 723. Described differently, portions of the respective first and second modification layers 713, 723 are arranged inside of the gaps 715, 725. The different portions of the modification layers 713, 723 may e.g. have cross-section in the y-x plane shaped as an L. Moreover, the composition of the first and second active layers, 714, 724 covering the anode parts 712a, 722a (i.e. which in FIG. 7a is a composition of only the donor material) may be arranged inside of the gaps 715, 725.

According to at least one example embodiment, at least one of the first and second modification layers 712, 723 comprises portions which are arranged inside of the gaps 715 between the plurality of first electrodes 712 and/or arranged inside of the gaps 725 between the plurality of second electrodes 722.

Corresponding to the solar cell module 1 of FIG. 2, it shall be understood that each pair of one anode part 712a of a first electrode 712 and an opposite cathode part 722b of a second electrode 722, or a cathode part 712b of a first electrode 712 and an opposite anode part 722a of a second electrode 722 together with the first 714 and second active layer 724 there between forms one solar cell.

During the lamination of the solar cell module 701 of FIG. 1 the different compositions of the first and second active layers 714, 724, respectively, may be deposited as stripes which after deposition and/or lamination forms a respective first and second continuous active layer 714, 724, covering the plurality of first and second electrodes 712, 722, respectively. That is, the first and second active layers 714, 724 may be deposit as stripes. For example, a first type of stripes 714A, 724A comprises the mixture of donor material and acceptor material may be deposit on the respective cathode parts 712b, 722b of said plurality of first electrodes 712 and/or said plurality of second electrodes 722. Furthermore, a second type of stripes 714B, 724B with only the donor material may be deposit on the anode parts 712a, 722a of the plurality of first electrodes 712 and/or the plurality of second electrodes 722. Thus, deposition of stripes of first and second types 714A, 724A, 714B, 724B may be carried out for cathode parts 712b, 722b and anode parts 712a, 722a of the electrodes of said plurality of first electrodes 712 and/or said plurality of second electrodes 722. Hereby, stripes of the first and second types 714A, 714B of the first active layer 714 will be in contact with each other and form a first continuous active layer 714 covering the plurality of first electrodes 712, and stripes of the first and second types 724A, 724B of the second active layer 724 will be in contact with each other and form a second continuous active layer 724 covering the plurality of second electrodes 722.

Figure 7B:
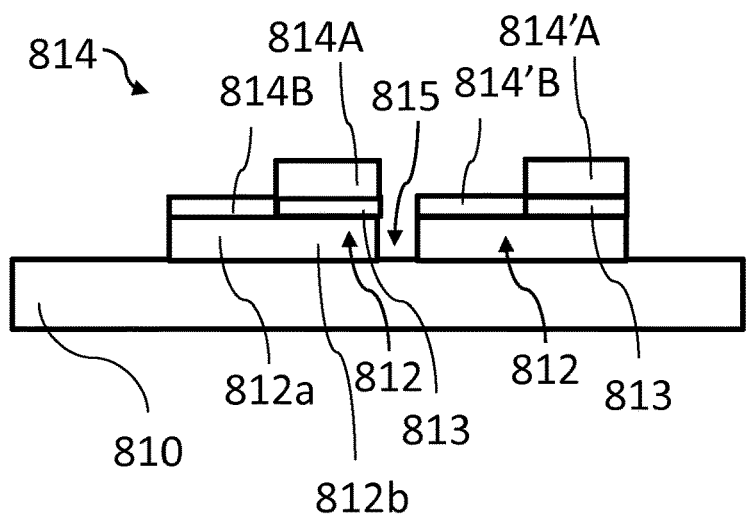
FIG. 7b shows a schematic and cross-sectional view of a part of a solar cell module in accordance with at least one embodiment of the invention.

FIG. 7b shows a cross-sectional view of a part of the x-y-plane of a solar cell module 801, and more specifically of a first substrate portion 810 and a plurality of first electrodes 812 (each electrode having an anode part 812a and a cathode part 812b at least partly defined by a modification layer 813, as previously described). The configuration of the solar cell module 801 is the same as described in relation to the solar cell module 1 in FIGS. 1 and 2 and the solar cell module 701 of FIG. 7a (the features are marked by the same reference numerals as in FIGS. 1 and 2, but with the addition of the value "800" in FIG. 7b) except for what is stated below. Thus, only the first substrate portion 810 and the plurality of first electrodes 812 together with a first active layer 814 is shown in FIG. 7b, but it should be understood that a second substrate portion, with a plurality of second electrodes and possibly a second active layer, is to be used in the lamination step similarly as described with reference to FIG. 7a.

In FIG. 7b, the active layer 814, here being a first discontinuous active layer 814, comprises layers segments 814A, 814B, 814'A, 814'B separated by layer segment gaps. Thus, each layer segment 814A, 814B, 814'A, 814'B of the first discontinuous active layer 814 is an active layer that cover only the electrode 812, or only a portion 812a, 812b of the electrode 812, at least in the x-direction, and not the gaps 815. In the z-direction, each layer segment 814A, 814B, 814'A, 814'B preferably covers the whole electrode 812, or said portion 812a, 812b of the electrode 812. In other words, the layer segments 814A, 814B, 814'A, 814'B are separate, in the x-direction, by layer segment gaps, e.g. between 0.01 mm and 1 mm, such as e.g. between 0.05 mm and 0.4 mm. Hence, as seen in FIG. 7b, the plurality of gaps 815 between the electrodes 812 in the plurality of first electrodes 812 are not covered by the first discontinuous active layer 814.

Correspondingly, but not shown, a second active layer may be a second discontinuous active layer which cover the electrodes in said plurality of second electrodes, or at least a portion of each electrode in the plurality of second electrodes, and which second discontinuous active layer comprises second layer segments separate by second layer segment gaps.

According to at least one alternative example embodiment, the layer segments 814B, 814'B covering the respective anode part 812a or cathode part 812b of the electrodes 812 in said plurality of first electrodes 812, may not be active layer, but may be another, non-photoactive layer (e.g. having an efficiency of less than 0.001 electron-hole pairs per absorbed photon).

The skilled person realizes that a number of modifications of the embodiments described herein are possible without departing from the scope of the invention, which is defined in the appended claims. For instance, the stripes of the plurality of the first and second electrode may for example be of any other curvature than the one shown in the figures. They may also be deposited such that their longest extension being in any direction between the x- and z-directions. Hence, they need not be neither parallel nor perpendicular to the longest extension of the substrate. The skilled person also realizes that other conducting or semiconducting materials can be used as either electrodes or in the active layers of the solar cell module.

The invention claimed is:

1. A method for laminating solar cell modules comprising a plurality of solar cells electrically connected in series, wherein said method comprises:
    providing a first and a second flexible substrate portion suitable for roll-to-roll deposition;
    providing a plurality of first electrodes on said first substrate portion and a plurality of second electrodes on said second substrate portion, wherein said plurality of first and second electrodes are provided as stripes spatially separated such that a plurality of gaps is formed between the electrodes in said plurality of first electrodes on said first substrate portion, and between the electrodes in said plurality of second electrodes on said second substrate portion;
    depositing a first discontinuous active layer on one of said plurality of first electrodes and said plurality of second electrodes, wherein said first discontinuous active layer is an organic active layer;
    depositing a second discontinuous active layer on the other of said plurality of first electrodes and said plurality of second electrodes; and
    laminating by means of heat and pressure said first and said second substrate portions together in a roll-to-roll process such that the first discontinuous active layer is brought into physical contact with the second discontinuous active layer and such that said first and said second discontinuous active layer are brought into electrical contact with said plurality of first electrodes and said plurality of second electrodes;
    wherein the step of laminating by means of heat and pressure further comprises that said first discontinuous active layer and said second discontinuous active layer are brought into physical contact and together forms a continuous active layer;
    wherein said plurality of first electrodes is arranged off-set relative said plurality of second electrodes such that each of said plurality of gaps between said plurality of second electrodes is fully covered at least in a direction which is orthogonal to the first and second substrate portions by respective one of said plurality of first electrodes.

2. The method according to claim 1, wherein said step of laminating by means of heat and pressure is performed at a temperature within the range of 50-300° C.

3. The method according to claim 1, wherein the step of depositing the first active layer is done by means of roll-to-roll coating.

4. The method according to claim 1, wherein the step of providing said plurality of first electrodes on said first substrate portion and said plurality of second electrodes on said second substrate portion further comprises providing each of said plurality of first electrodes with an anode part and a cathode part by providing a modification layer on each of said plurality of first electrodes provided as stripes on said substrate, which modification layer partially covers each of said plurality of first electrodes provided as stripes on said substrate, whereby each of said first electrodes comprises a modification layer.

5. The method according to claim 4, wherein said modification layer comprises several sub-layers.

6. The method according to claim 1, wherein the step of providing said plurality of first electrodes on said first substrate portion and said plurality of second electrodes on said second substrate portion further comprises providing each of said plurality of second electrodes with an anode part and a cathode part by providing a modification layer on each of the plurality of second electrodes provided as stripes on said substrate, which modification layer partially covers each of said plurality of second electrodes provided as stripes on said substrate, whereby each of said second electrodes comprises a modification layer.

7. The method according to claim 6, wherein said modification layer comprises several sub-layers.

* * * * *